US007564043B2

(12) United States Patent
Hayashi et al.

(10) Patent No.: US 7,564,043 B2
(45) Date of Patent: Jul. 21, 2009

(54) MCP UNIT, MCP DETECTOR AND TIME OF FLIGHT MASS SPECTROMETER

(75) Inventors: Masahiro Hayashi, Hamamatsu (JP); Yuuya Washiyama, Hamamatsu (JP); Akio Suzuki, Hamamatsu (JP); Masahiko Iguchi, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 242 days.

(21) Appl. No.: 11/802,771

(22) Filed: May 24, 2007

(65) Prior Publication Data

US 2008/0290267 A1 Nov. 27, 2008

(51) Int. Cl.
*H01J 37/252* (2006.01)

(52) U.S. Cl. ...................................... 250/397; 250/287

(58) Field of Classification Search ................ 250/397, 250/283, 287, 299, 300; 313/103 CM, 105 CM
See application file for complete search history.

(56) References Cited

U.S. PATENT DOCUMENTS 4,709,140 A 11/1987 Oba
5,326,978 A * 7/1994 Aebi et al. .................. 250/397
5,391,874 A 2/1995 Ellis
5,528,034 A * 6/1996 Yamazaki et al. ............. 850/43
6,229,142 B1 5/2001 Bateman et al.
6,265,812 B1 7/2001 Watanabe et al.
6,756,587 B1 6/2004 Bateman et al.
6,828,729 B1 12/2004 Owens et al.
6,958,474 B2 10/2005 Laprade et al.
7,026,177 B2 4/2006 Laprade
7,180,060 B2 * 2/2007 Chefetz et al. .............. 250/291

FOREIGN PATENT DOCUMENTS

JP 6-28997 2/1994
JP 2007-87885 4/2007

* cited by examiner

*Primary Examiner*—Kiet T Nguyen
(74) *Attorney, Agent, or Firm*—Drinker Biddle & Reath LLP

(57) ABSTRACT

The present invention relates to an MCP unit or the like having a structure intended to achieve a desired time response characteristic, without depending on a limitation imposed by a channel diameter of MCP. The MCP unit comprises the MCP for releasing secondary electrons internally multiplied in response to incidence of charged particles, an anode arranged in a position where the secondary electrons reach, and an acceleration electrode arranged between the MCP and the anode. In particular, the acceleration electrode includes a plurality of openings which permit passing of the secondary electrons migrating from the MCP toward the anode. Further, the acceleration electrode is arranged such that the shortest distance B between the acceleration electrode and the anode is longer than the shortest distance A between the MCP and the acceleration electrode. Thus, an FWHM of a detected peak appearing in response to the incidence of the charged particles is remarkably shortened.

12 Claims, 18 Drawing Sheets

| | | | |
|---|---|---|---|
| DISTANCE A BETWEEN MCP-MESH (mm) | 1.1 | 1.1 | 2.6 |
| DISTANCE B BETWEEN MESH-ANODE (mm) | 1.1 | 2.6 | 1.1 |
| RISE TIME (ns) | 0.364 | 0.369 | 0.444 |
| FALL TIME (ns) | 2.65 | 1.65 | 2.10 |
| FULL WIDTH AT HALF MAXIMUM FWHM (ns) | 1.10 | 0.67 | 1.05 |

*Fig.11A*
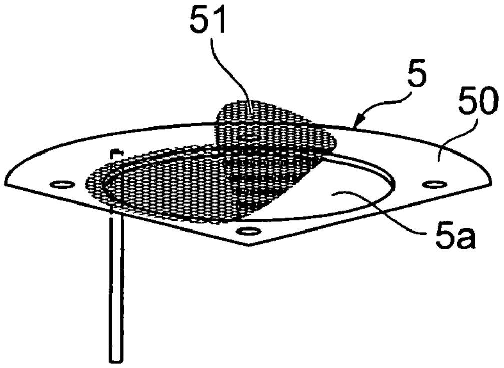
*Fig.11B*
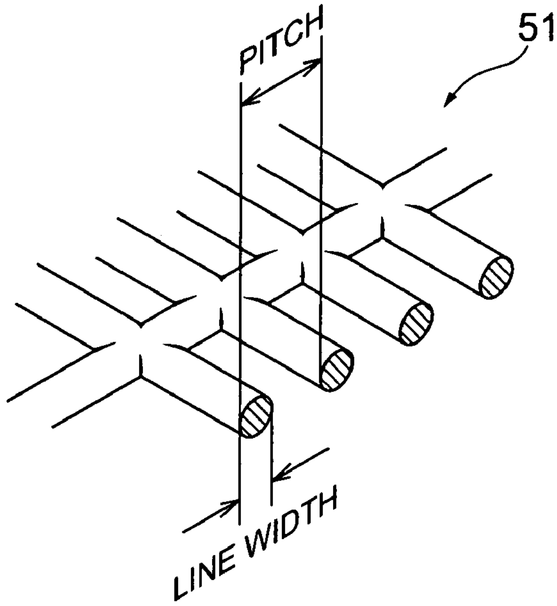
*Fig.11C*
| PITCH (mm) | 0.1 | 0.2 | 0.3 | 0.4 | 0.5 | 0.6 | 0.7 | 0.8 |
|---|---|---|---|---|---|---|---|---|
| LINE WIDTH ($\mu$m) | 40 | 40 | 40 | 40 | 40 | 40 | 40 | 40 |
| OPENING RATIO (%) | 36 | 64 | 75 | 81 | 85 | 87 | 89 | 90 |

| OPENING RATIO (%) | PITCH (mm) | LINE WIDTH ($\mu$m) | RISE TIME (ps) |
|---|---|---|---|
| 100 | 40-mm OPENING | — | 520 |
| 93 | 3.0 | 100 | 420 |
| 90 | 2.0 | 100 | 405 |
| 81 | 0.4 | 40 | 395 |
| 64 | 0.2 | 40 | 395 |
| NO ACCELERATING ELECTRODE | | | 520 |

MCP UNIT, MCP DETECTOR AND TIME OF FLIGHT MASS SPECTROMETER

BACKGROUND OF THE INVENTION

1. Field of the Invention

The present invention relates to an MCP unit having a multiplying function of charged particles such as electrons and ions, an MCP detector including the MCP unit, and a time-of-flight mass spectrometer including the MCP detector, as relevant parts of a detector used for time-of-flight mass spectrometry or the like.

2. Related Background Art

As a method of detecting a polymer molecular weight, time-of-flight mass spectrometry (TOF-MS) is known. FIG. 1 is a diagram for describing a configuration of an analyzing device (hereinafter, referred to as a TOF-MS device) by the TOF-MS.

As shown in FIG. 1, in the TOF-MS device, a detector 100 is arranged at one end in a vacuum chamber 110, and a sample (ion source) 120 is arranged at the other end in the vacuum chamber 110. Between the detector 100 and the sample 120, a ring-shaped electrode 130 (ion accelerator) having an opening is arranged. The electrode 130 is grounded, and when the sample 120 to which a predetermined voltage is being applied is irradiated with a laser beam from an ion extracting system (that includes a laser light source), ions released from the sample 120 are accelerated by an electric field formed between the sample 120 and the electrode 130 and collide with the detector 100. Acceleration energy applied to the ions between the sample 120 and the electrode 130 is determined by an ionic charge. Thus, when the ionic charge is identical, a velocity achieved when the ionic charge passes through the electrode 130 depends on the weights of ions. Additionally, between the electrode 130 and the detector 100, the ions travel at a constant velocity. Thus, a time of flight of the ions between the electrode 130 and the detector 100 is inversely proportional to the velocity. That is, an analyzing section calculates the time of flight from the electrode 130 to the detector 100 to determine the weights of ions (an output voltage from the detector 100 is monitored with an oscilloscope). Visually, it becomes possible to determine the weights of ions from an occurrence time of a peak appearing in a time spectrum of the output voltage displayed on the oscilloscope.

As a detector applicable to such a TOF-MS device, an MCP detector disclosed in Japanese Patent Application Laid-Open No. H6-28997 (reference document 1), for example, is known. FIG. 2 is a schematic cross-sectional view showing one example of an MCP detector applicable to the TOF-MAS device. In an MCP detector 100*a* shown in FIG. 2, two micro-channel plates (MCP) 20 and 21 (hereinafter, referred to as an MCP cluster 2) are sandwiched by an IN-electrode 1 and an OUT-electrode 3, each of which is formed with an opening at its center. Before the IN-electrode 1, while a wire mesh-like grid electrode 106 held by a frame 105 is arranged, behind the OUT-electrode 3, an anode electrode 4 is arranged. Further, on a shield side of a signal-reading BNC terminal (Bayonet Neil-Concelman connector) 60, a casing 5*x* comprised of a conductive material is connected while on a core wire 601 side, an electrode 47 is connected. Between the casing 5*x* and the OUT-electrode 3, and between the electrode 47 and the anode electrode 4, dielectrics 22 and 46 are arranged, respectively, thereby to form capacitors.

In the MCP detector 100*a* having the above-described structure, when charged particles are incident upon the MCP cluster 2, a great number of electrons (secondary electrons multiplied by the respective MCPs) are released from the MCP cluster 2 in response thereto. The secondary electrons thus released reach the anode electrode 4 and are then converted into an electric signal as a change of voltage or current (a signal is outputted from the core wire 601). At this time, the capacitor is formed between the anode electrode 4 and the core wire 601. Thus, a detection signal is outputted to the outside by a ground potential, and the existence of the capacitor formed between the casing 5*x* and the OUT-electrode 3 inhibits occurrence of waveform distortion or ringing of the output signal.

SUMMARY OF THE INVENTION

Recently, in the TOF-MS, with the advent of a characteristic improvement, in an area ranging from an ion source to a detector, achieved due to development of an ionization method or ionic optics, or a characteristic improvement of an analysis system achieved due to development in electronics, a further characteristic improvement of the detector has been increasingly demanded. Then, the inventors have studied in detail the above-described conventional MCP detector, and as a result, have found problems as follows.

That is, desired is an improvement of a "Mass Resolution" which represents a mass spectrometry capability of an entire system ranging from an ion source to a data analysis. A mass resolution R is given by $t/(2\cdot\Delta t)$, where t is a time of flight of ions, and $\Delta t$ is a full width at half maximum (FWHM) of a detected peak in a mass spectrum (a time spectrum in which a detection of ions different in mass is represented by a voltage change). That is, to increase the mass resolution, it is necessary to extend the time of flight of ions or decrease the FWHM of the detected peak in the mass spectrum. However, the extension of the time of flight cannot be performed by the existing TOF-MS device. Additionally, in the conventional MCP detector, even when the arrangement of the MCP and the anode is adjusted, a rise time and a fall time of the detected peak in the time spectrum are changed in an associated manner, and thus, it is not possible to perform waveform shaping of the detected peak.

On the other hand, in the conventional MCP detector, a time characteristic is thought to be limited depending on a channel diameter and an effective diameter in the MCP, and thus, an MCP with a channel diameter as small as possible is preferable. However, many manufacturing difficulties are found in rendering the channel diameter small while maintaining a large effective diameter, which is a characteristic of the MCP. In particular, when the channel diameter is small, a thickness of the MCP itself results in being relatively thin. This causes a bending or the like to be produced.

In order to overcome the above-mentioned problems, it is an object of the present invention to provide, for achieving a desired time response characteristic without depending on a limitation imposed by a channel diameter of an MCP, an MCP unit having a structure that permits arbitrarily controlling a rise time and a fall time of a detected peak in a time spectrum, an MCP detector including the MCP unit, and a time-of-flight mass spectrometer including the MCP detector. The MCP unit according to the present invention is a charged-particle multiplying unit for extracting from an anode (electron-collection electrode), electrons, as an electric signal, cascade-multiplied by MCP in response to incidence of charged particles such as ions and electrons, and is applicable to a photomultiplier tube and the like, in addition to an ultra-fast electron detector applicable to a TOF-MS device.

In particular, the MCP unit according to the present invention comprises an MCP assembly, an anode, and an acceleration electrode arranged between the MCP assembly and the anode.

The MCP assembly comprises an MCP, and first and second electrodes for applying a predetermined voltage between an electron incident surface and an electron exit surface in the MCP. The MCP is arranged on a plane that intersects a predetermined reference axis, and function to release secondary electrons internally multiplied in response to incidence of charged particles such as ions and electrons. The first electrode is in contact with the incident surface such that an incident surface side of the MCP is set to a predetermined potential. The first electrode includes an opening which permits passing of the charged particles migrating toward the MCP. The second electrode is in contact with the exit surface such that an exit surface side of the MCP is set higher in potential than the first electrode. The second electrode also includes an opening which permits passing of the secondary electrons exited from the exit surface of the MCP. The anode is an electron-collection electrode arranged, in a state to intersect the above-described reference axis, in a position where the secondary electrons released from the exit surface of the MCP reach. The anode is set higher in potential than the second electrode. The acceleration electrode is an electrode, arranged between the MCP and the anode, set higher in potential than the second electrode. The acceleration electrode includes a plurality of openings which permit passing of the secondary electrons migrating from the exit surface of the MCP toward the anode.

In particular, in the MCP unit according to the present invention, the acceleration electrode is arranged between the MCP and the anode so that a shortest distance B to the anode is longer than a shortest distance A to the exit surface of the MCP.

As described above, in the MCP unit according to the present invention, an arrangement condition among three kinds of electrodes such as the MCP, the acceleration electrode, and the anode is adjusted. Thus, it becomes possible to reduce a full width at half maximum (FWHM) of a peak appearing on a detected time spectrum. That is, the adjustment of the distance A between the MCP and the acceleration electrode contributes to control of a rise time of a detected peak, and the adjustment of the distance B between the acceleration electrode and the anode contributes to control of a fall time of the detected peak. In other words, the acceleration electrode is arranged between the MCP and the anode so that a condition of $A<B$ is satisfied, and thus, it becomes possible to greatly shorten the fall time of the detected peak, thereby improving the time response characteristic. For example, in the TOF-MS, the FWHM of the detected peak appearing in the time spectrum in each charged particle different in mass is reduced. Thus, as a result of the MCP unit being applied, it becomes possible to remarkably improve the time response characteristic.

It is noted that in the MCP unit according to the present invention, a shortest distance A from the exit surface of the MCP to the acceleration electrode is preferably 0.1 mm or more but 2.0 mm or less. Further, the shortest distance B from the acceleration electrode to the anode is preferably 1.0 mm or more but 10 mm or less.

In the MCP unit according to the present invention, the acceleration electrode is preferably set to the same potential as that of the anode. The reason for this is that in this case, an acceleration area of the secondary electrons released from the MCP is limited (reduced to half or smaller, as compared to the conventional MCP detector in which the acceleration area ranges from the MCP to the anode), and thus, a released time spreading is inhibited.

In the MCP unit according to the present invention, an effective area in the acceleration electrode is preferably wider than an effective area (an area in which a channel for releasing secondary electrons is formed) of the exit surface in the MCP. The reason for this is that a collision of the secondary electrons with the acceleration electrode is inhibited, improving detection sensibility.

In the MCP unit according to the present invention, an opening ratio of the effective area in the acceleration electrode is preferably 60% or more but 95% or less. The reason for this is that when the opening ratio is below 60%, the number of passed electrons (transmissivity of the acceleration electrode) decreases, and an amount of signals obtained from the anode is reduced; and when the opening ratio exceeds 95%, however, waveform shaping of a detected peak in an obtained time spectrum cannot be practically performed.

The MCP unit according to the present invention may further comprise a delay electrode arranged between the exit surface of the MCP and the acceleration electrode. The delay electrode also includes, similar to the acceleration electrode, a plurality of openings which permit passing of the secondary electrons migrating from the exit surface of the MCP toward the anode. In particular, the delay electrode is preferably set equal to or lower in potential than the second electrode. The opening ratio of the delay electrode is preferably 60% to 95%, similar to the acceleration electrode. In particular, when the delay electrode is set lower in potential than the second electrode, it becomes possible to eliminate secondary electrons of low energy, thereby further inhibiting a time spreading of the secondary electrons; as compared to a case where the acceleration electrode is arranged. In this case, the delay electrode is preferably arranged in a position so that a shortest distance to the exit surface of the MCP is longer than a shortest distance to the acceleration electrode.

The MCP detector according to the present invention is an MCP detector comprising an MCP unit (an MCP unit according to the present invention) that has the above-described structure. The MCP detector comprises a signal output section arranged to sandwich, together with the MCP, the anode. The signal output section includes a signal line electrically connected to the anode.

In the MCP detector according to the present invention, the signal output section includes a coaxial cable that comprises the signal line and a shield part surrounding the signal line. In this case, it is preferred that the MCP detector further comprises a capacitor having a terminal of which one side is electrically connected to the shield part and a terminal of which the other side is electrically connected to the acceleration electrode. The reason for this is that in this configuration, occurrence of ringing of an output signal is effectively inhibited.

Further, the MCP detector having the above-described structure can be applied to a time-of-flight mass spectrometer as shown in FIG. 1. That is, the time-of-flight mass spectrometer according to the present invention comprises: a vacuum chamber having therein an ion source being arranged; an ion extracting system; an ion accelerator; an MCP detector (an MCP detector according to the present invention) having the above-described structure; and an analyzing section.

The vacuum chamber is a chamber having an internal space depressurized to a predetermined degree of vacuum, and has therein a sample, which is to be analyzed as an ion source. The ion extracting system comprises a structure for allowing ions to be released from the sample arranged in the vacuum chamber. For example, when a plurality of kinds of ions different in mass are released from the sample by a laser irradiation, the ion extracting system preferably comprises a laser light source for outputting a laser beam and an optical system for guiding to the sample the laser beam outputted from the laser light source. To accelerate the ions released from the sample, the ion accelerator is arranged in the vacuum chamber. The ion accelerator includes, for example, a ring-shaped electrode that has an opening for permitting passing of the ions released from the sample. Further, as information about the ions released from the sample, the analyzing section determines at least masses of ions. More specifically, the analyzing section detects a time of flight from the ion accelerator to the MCP detector, based on a detection signal from the MCP detector, to determine the masses of ions that reach the MCP detector.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will be apparent to those skilled in the art from this detailed description.

BRIEF DESCRIPTION OF THE DRAWINGS

FIGS. 11A to 11C are diagrams for describing a structure of an acceleration electrode;

DETAILED DESCRIPTION OF THE PREFERRED EMBODIMENTS

In the following, embodiments of an MCP unit, an MCP detector, and a time-of-flight mass spectrometer, according to the present invention, will be explained in detail with reference to FIGS. 1, 3 to 6, 7A, 7B, 8, 9A to 13B, and 14 to 16. In the explanation of the drawings, constituents identical to each other will be referred to with numerals identical to each other without repeating their overlapping descriptions.

Figure 1:
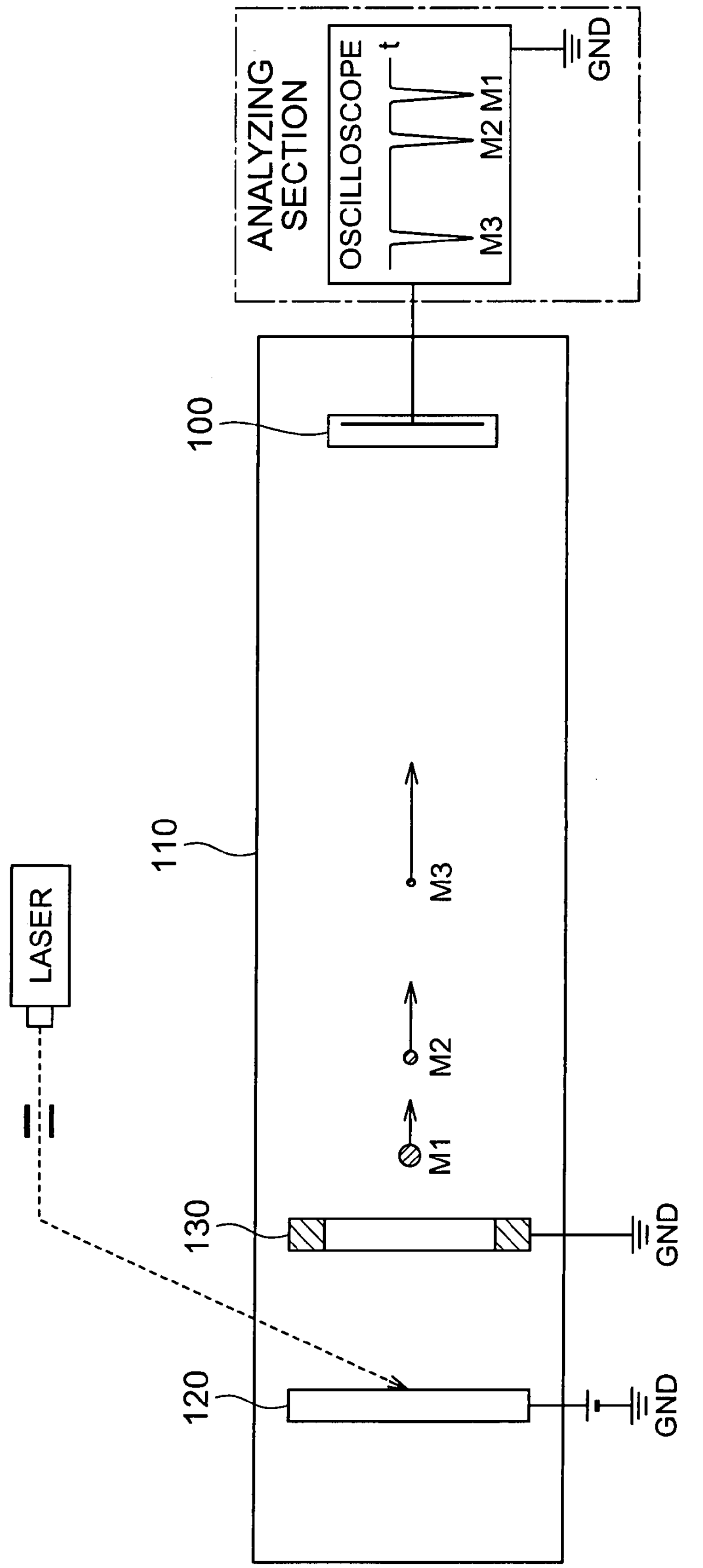
FIG. 1 is a diagram showing a configuration of a TOF-MS device.
Figure 2:
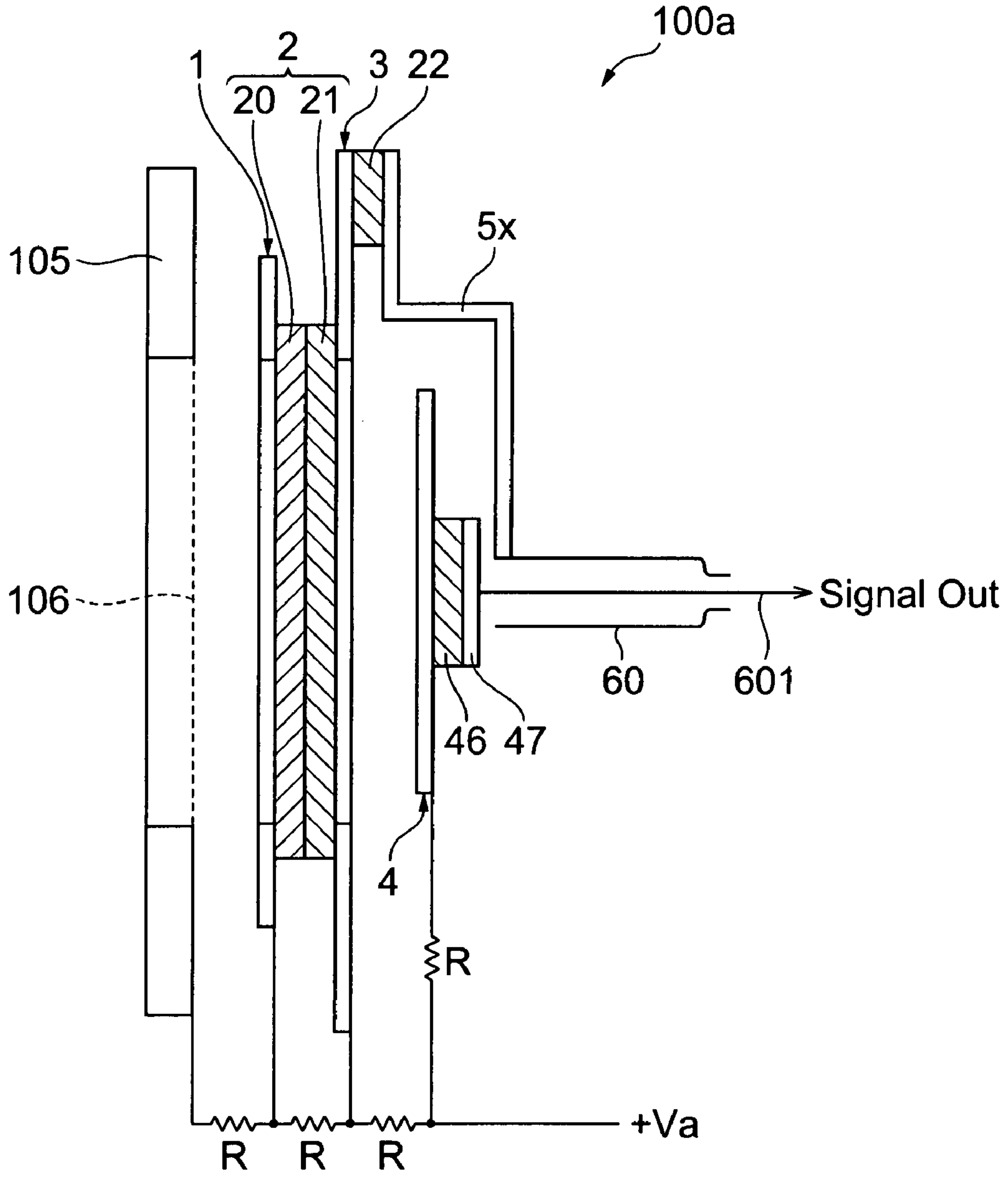
FIG. 2 is a schematic cross-sectional view showing one example of a detector applied to the TOF-MS device.

As shown in FIG. 1, the time-of-flight mass spectrometer according to the present invention comprises: the vacuum chamber 110 of which the interior is depressurized to a predetermined degree of vacuum; the ion extracting system including a laser light source; the ring-shaped electrode 130, which is the ion accelerator; the detector 100; and the analyzing section. The MCP detector according to the present invention is suitably applicable to the detector 100, and in the descriptions below, respective embodiments of the MCP unit and the MCP detector including the same (the MCP unit and the MCP detector according to the present invention) as a detector applicable to the time-of-flight mass spectrometer according to the present invention are described in detail.

First Embodiment

Figure 3:
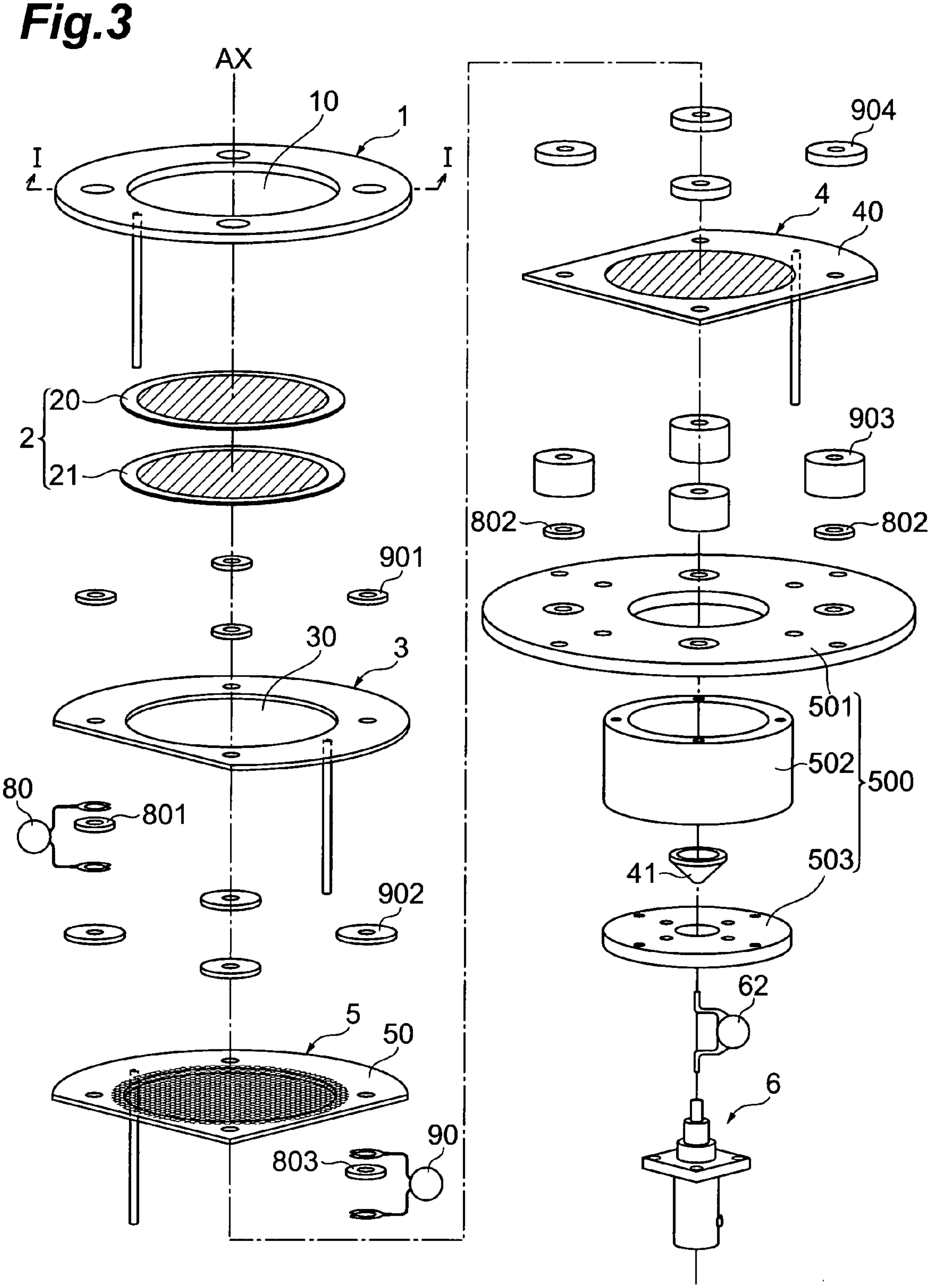
FIG. 3 is an assembly process chart (4-terminal voltage application structure) showing a configuration of a first embodiment of an MCP detector according to the present invention.
Figure 4:
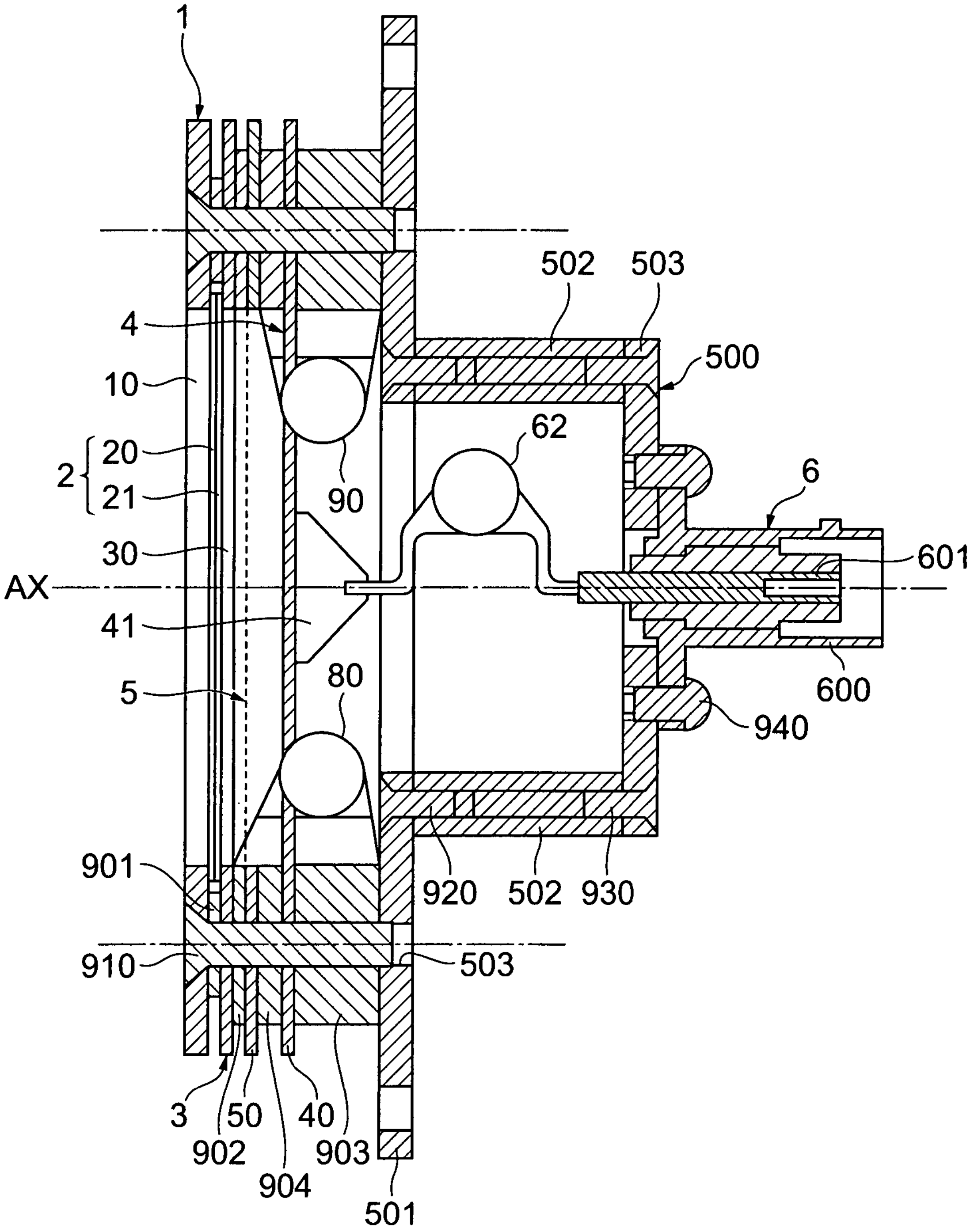
FIG. 4 is a diagram showing a cross-sectional structure, along the line I-I in FIG. 3, of the MCP detector according to the first embodiment.
Figure 5:
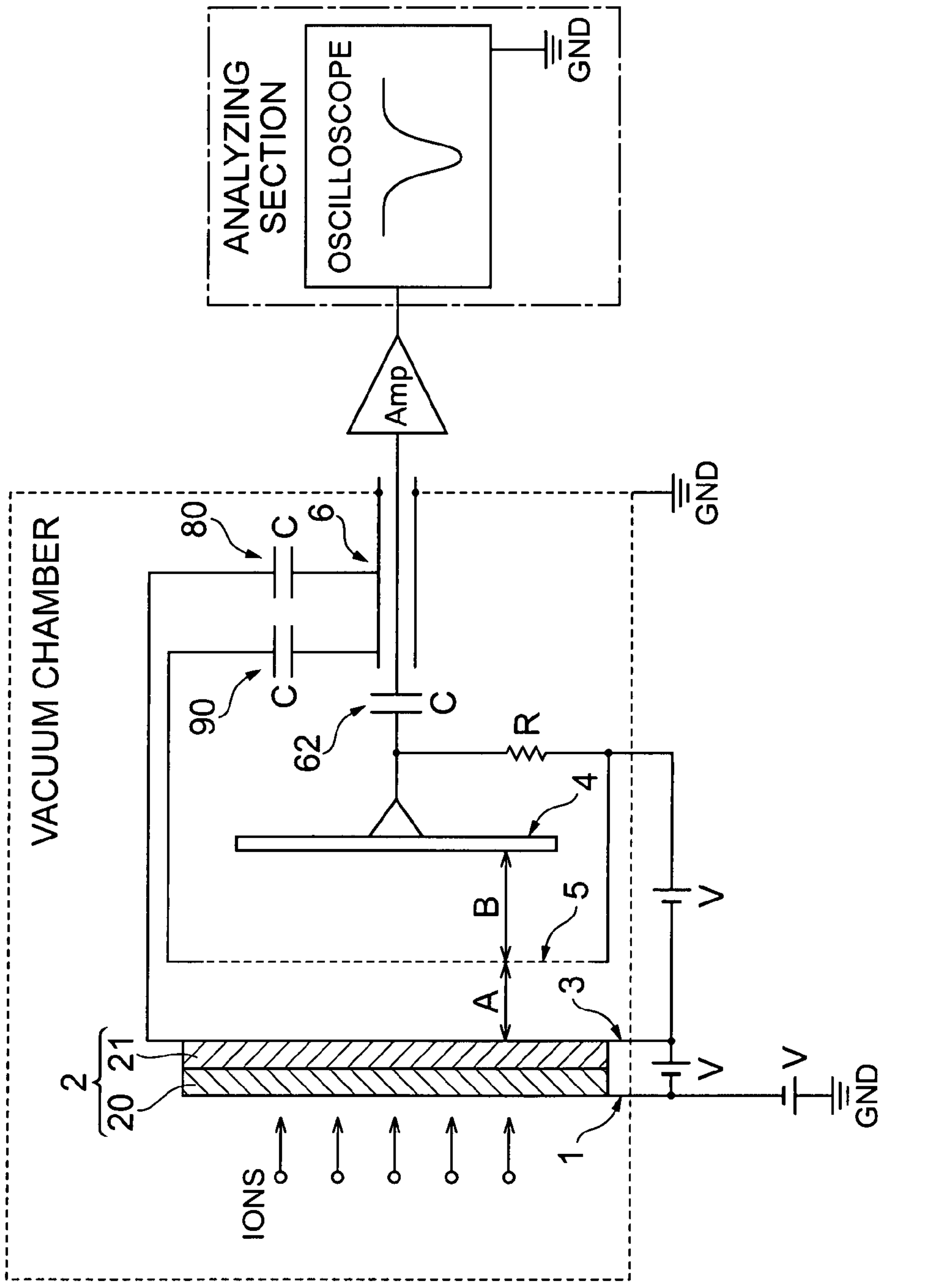
FIG. 5 is an equivalent circuit diagram of the MCP detector according to the first embodiment shown in FIGS. 3-4.

FIG. 3 is an assembly process chart showing a configuration of the first embodiment of the MCP detector according to the present invention. FIG. 4 is a diagram showing a cross-sectional structure, along the line I-I in FIG. 3, of the MCP detector according to the first embodiment. FIG. 5 is an equivalent circuit diagram of the MCP detector according to the first embodiment shown in FIGS. 3-4.

The MCP detector according to the first embodiment has a configuration in which an IN-electrode 1 (first electrode), an MCP cluster 2, an OUT-electrode 3 (second electrode), an acceleration electrode 5, and an anode electrode 4 (third electrode) are arranged in this order along a tube axis (reference axis) AX. The MCP cluster 2 is constituted by two disk-shaped MCPs 20, 21. On an incident surface (front surface where charged particles reach) side of the MCP cluster 2, the IN-electrode 1 (first electrode) is arranged, while on an exit surface (rear surface) side thereof, the OUT-electrode 3 (second electrode) is arranged. Thus, an MCP assembly is constituted by the MCP cluster 2, and the IN-electrode 1 and the OUT-electrode 3 that sandwich the MCP cluster 2. The MCP detector shown in FIG. 3 and FIG. 4 adopts, as a voltage application structure to each electrode, a 4-terminal voltage application structure such that a voltage-applying lead is arranged to each of the IN-electrode (first electrode) 1, the OUT-electrode (second electrode) 3, the acceleration electrode 5 (acceleration electrode substrate 50), the anode electrode 4 (anode electrode substrate 40).

The IN-electrode 1 is a metallic electrode (comprised of stainless steel, for example) having a donut-like shape in which the opening 10 is formed at its center. A board surface of the IN-electrode 1 is formed with holes into which four countersunk screws 910, arranged to be spaced apart by 90 degrees about the tube axis AX, are inserted. The rear surface of the IN-electrode 1 is electrically connected with an IN-lead, comprised of a conductive material (comprised of stainless steel, for example), having a rod-like shape extending from a backward direction. A connection position between the IN-electrode 1 and the IN-lead lies in the middle of the two adjacent holes. The IN-lead is held in a state to be inserted into an IN-lead insulator comprised of an insulating material, and in this configuration, the IN-lead is insulated from the other constituent components. For the IN-lead insulator, a PEEK (PolyEtheretherKetone) resin excellent in workability, heat resistance, anti-shock property, and insulating property is appropriate, for example.

The OUT-electrode 3 is also a metallic electrode having a donut-like shape in which the opening 30 is formed at its center, similar to the IN-electrode 1. However, the OUT-electrode 3 has a configuration such that a part thereof is cut so as not to be in contact with the IN-lead insulator accommodating the IN-lead. On the board surface of the OUT-electrode 3, similar holes are arranged in positions corresponding to the holes of the IN-electrode 1. The rear surface of the OUT-electrode 3 is electrically connected with an OUT-lead, comprised of a conductive material (comprised of stainless steel, for example), having a rod-like shape extending from a backward direction. The OUT-lead is arranged in a position, as viewed from the front, obtained by rotating the IN-lead by 90 degrees about the tube axis AX in a counterclockwise direction. The OUT-lead is also held (insulated from the other constituent components) in a state to be inserted into the OUT-lead insulator comprised of a PEEK resin, for example, similar to the IN-lead.

Between the IN-electrode 1 and the OUT-electrode 3, MCP insulators 901, comprised of an insulating material, having a donut-like shape are arranged in positions corresponding to the respective holes of the IN-electrode 1 and the OUT-electrode 3. The MCP insulators 901 are comprised of a PEEK resin, for example, and have a thickness slightly thinner than that of the MCP cluster 2. The MCP assembly in which the MCP cluster 2 is thus sandwiched by the IN-electrode 1 and the OUT-electrode 3 is obtained by accurately assembling such that centers of the disk-shaped MCPs 20, 21 correspond to those of the openings 10 and 30 of the respective IN-electrode 1 and the OUT-electrode 3.

Behind the OUT-electrode 3, the acceleration electrode substrate 50 is arranged in a spaced manner. The acceleration electrode substrate 50 is a metallic electrode having a circular opening at its center, and is provided with a metallic mesh in a manner to cover the opening. The acceleration electrode 5 is constituted by the acceleration electrode substrate 50 and the metallic mesh. The acceleration electrode substrate 50 has a cutaway configuration so as not to be in contact with the IN-lead insulator accommodating the IN-lead and the OUT-lead insulator accommodating the OUT-lead. As described above, the acceleration electrode substrate 50 is spaced from the OUT-electrode 3. Thus, the acceleration electrode substrate 50 is provided with holes in positions corresponding to the holes of the OUT-electrode 3, and between the acceleration electrode substrate 50 and the OUT-electrode 3, a thin plate 801 comprised of a conductive material and insulators 902 comprised of an insulating material, both of which have a donut-like shape, are arranged. The thin plate 801 is a metallic part for sandwiching, with the OUT-electrode 3, one end of the capacitor 80. For the thin plate 801, a member excellent in ductility is appropriate, and an example preferably includes a member in which a phosphor-bronze plate is plated with gold or copper. For the insulators 902, a PEEK resin is applicable, for example. It is noted that the opening arranged in the acceleration electrode substrate 50 defines an effective area (a mesh area through which the secondary electrons released from the MCP cluster 2 pass) of the acceleration electrode 5, and is wider than an effective area (an area releasing the secondary electrons) of the MCP cluster 2.

Behind the acceleration electrode substrate 50, an anode substrate 40 is arranged in a spaced manner. The anode substrate 40 has a disk-like shape formed of a glass epoxy resin, and on its top and bottom surfaces are formed with predetermined patterns of a metallic thin film such as copper. The top-surface metallic thin film pattern and the bottom-surface metallic thin film pattern are conducting. The anode substrate 40 has a cutaway configuration so as not to be in contact with the IN-lead insulator accommodating the IN-lead and the OUT-lead insulator accommodating the OUT-lead. As described above, the anode substrate 40 is spaced from the acceleration electrode substrate 50. Thus, the anode substrate 40 is provided with holes in positions corresponding to the holes of the acceleration electrode substrate 50, and between the anode substrate 40 and the acceleration electrode substrate 50, a thin plate 803 comprised of a conductive material and insulators 904 comprised of an insulating material, both of which have a donut-like shape, are arranged. The thin plate 803 is a metallic part for sandwiching, with the acceleration electrode substrate 50, one end of a capacitor 90. For the thin plate 803, a member excellent in ductility is appropriate, and an example preferably includes a member in which a phosphor-bronze plate is plated with gold or copper. For the insulators 904, a PEEK resin is applicable, for example.

Out of the metallic thin film patterns formed on each of the top and bottom surfaces of the anode substrate 40, the top-surface metallic thin film pattern is a circular shape that corresponds to that of the opening 30 of the OUT-electrode 3, and the opening 30 and the top-surface metallic thin film pattern are coaxially arranged. On the other hand, the bottom-surface metallic thin film pattern is an approximately linear pattern that radially extends in one direction from the center of the anode substrate 40, and an end on the outside of the bottom surface is electrically connected with an anode lead, comprised of a conductive material (comprised of stainless steel, for example), having a rod-like shape extending from a backward direction. The anode lead is arranged in a position, as viewed from the front, obtained by rotating the OUT-lead by 90 degrees about the tube axis AX in a counterclockwise direction. That is, the anode lead is arranged in a position symmetrically, about the tube axis AX, to the IN-lead. The anode lead is also held in a state to be inserted into an anode lead-use insulator comprised of a PEEK resin, for example, similar to the IN-lead and the OUT-lead, and thus, the anode lead is insulated from the other constituent components.

Into the center of the bottom-surface metallic thin film pattern, an anode terminal 41 comprised of copper is screwed. The anode electrode (third electrode) 4 is constituted by the anode terminal 41 and the anode substrate 40.

Behind the anode electrode 4, a rear cover 500 is arranged. The rear cover 500 is constituted by a substrate 501 having a donut-like shape, a cylindrical portion 502, and a substrate 503 similarly having a donut-like shape. The cylindrical portion 502 is sandwiched between the substrates 501 and 503 and secured by screws 920 and 930, and in the rear cover 500, the inner circumference of the substrate 501 and the outer circumference of the substrate 503 are thus connected via the cylindrical portion 502, and as a result, the rear cover 500 is rendered a casserole-shaped member. All the substrates 501, 503 and the cylindrical portion 502 are comprised of metal (comprised of stainless steel, for example). The substrate 501 is provided with screw holes, and at the rear surface of the anode electrode 4, the rear cover 500 is arranged with insulators 903 and thin plates 802 being sandwiched therebetween. At this time, electrically insulating screws 910 (a PEEK resin is applicable, for example) are fastened into the screw holes, and thus, each of the electrodes 1, 3 and 4, and the MCP cluster 2 is secured to the rear cover 500. The thin plates 802, together with the substrate 501, are metallic parts for sandwiching the other end of each of the capacitors 80 and 90. The thin plates 802 may be formed of a material similar to that of the thin plates 801 and 803. For the insulators 903, a PEEK resin is applicable, for example. The substrate 501 has holes into which the respective lead-use insulators are inserted.

At the center of the substrate 503, a BNC terminal 6, which is a signal output section, is secured by a screw 940. An outside 600 of the BNC terminal 6 is electrically connected to the substrate 501 of the rear cover 500. On the other hand, a core wire 601 inside the BNC terminal 6 is connected via a capacitor 62 to the anode terminal 41. The capacitor 62 has a function to render a signal output level a GND level by insulating output.

Between the OUT-electrode 3 and the substrate 501, the four capacitors 80, of which respective terminals are electrically connected to the OUT-electrode 3 and the substrate 501 by the above-described thin plates 801 and the thin plates 802, are equally spaced apart about the tube axis AX. The substrate 501, the cylindrical portion 51, and the substrate 52 are metallic, and thus, one end of the capacitors 80 results in being electrically connected to the outside 600 of the BNC terminal 6. Likewise, between the acceleration electrode substrate 5 and the substrate 501, the four capacitors 90, of which respective terminals are electrically connected to the acceleration electrode substrate 5 and the substrate 501 by the above-described thin plates 803 and the thin plates 802, are equally spaced apart about the tube axis AX. Therefore, these capacitors 90 are also mounted between the metallic substrate 501 and the acceleration electrode substrate 50. As a result, one ends of the capacitors 90 are electrically connected to the outside 600 of the BNC terminal 6.

In the MCP detector, thus configured, according to the first embodiment, the IN-electrode 1, the OUT-electrode 3, the acceleration electrode 5 having a metallic mesh, and the anode electrode 4 are set to predetermined potentials, as shown in FIG. 5. That is, when a minus potential set to the IN-electrode 1 is served as a reference, the OUT-electrode 3 is set to a minus potential higher than the IN-electrode 1. The acceleration electrode 5 and the anode 6 are set to a minus potential higher than the OUT-electrode 3. It is noted that the acceleration electrode 5 and the anode 4 may be set to the same potential. Thus, the MCP detector according to the first embodiment has a floating anode structure in which an anode potential is not grounded.

Figure 6:
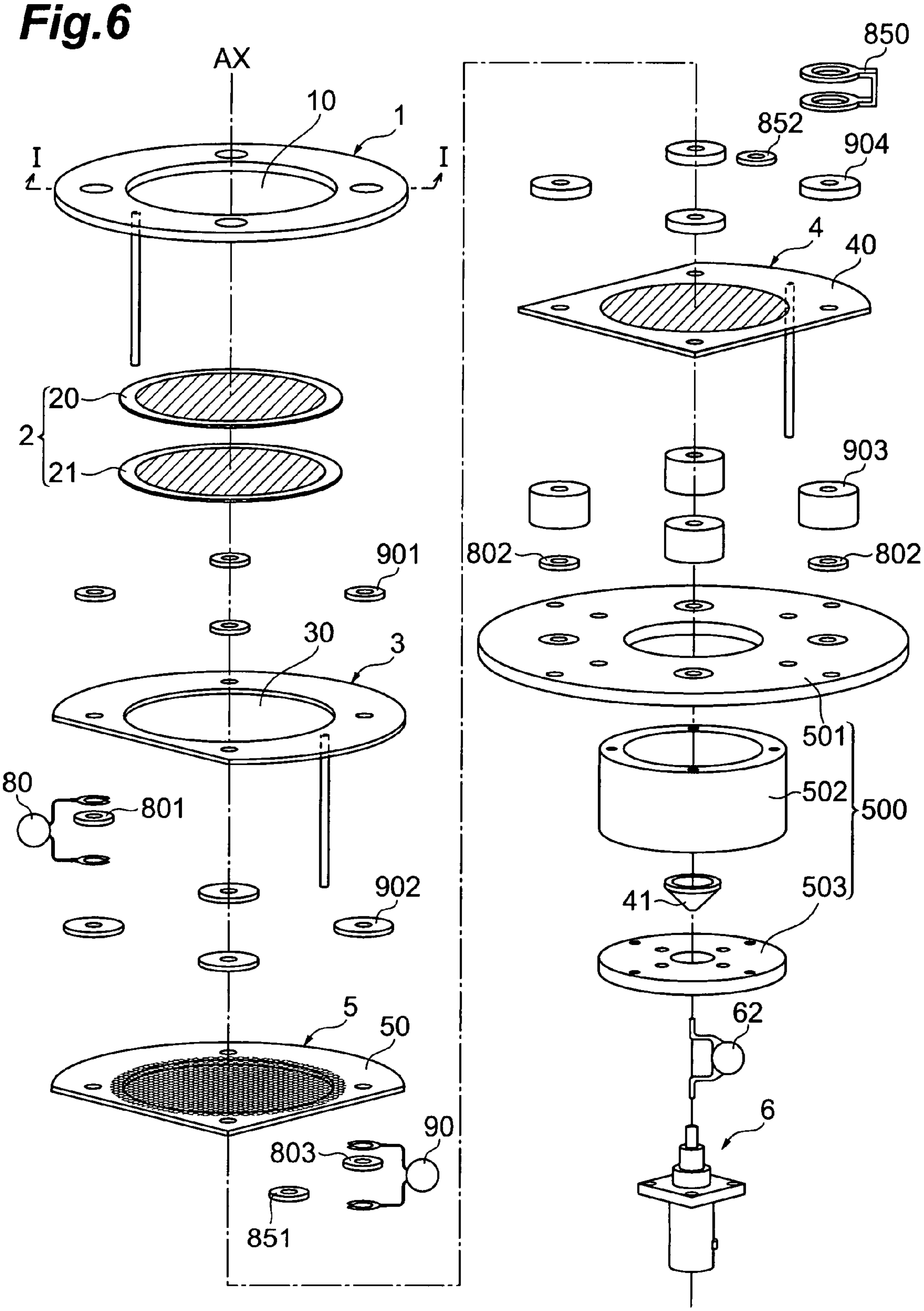
FIG. 6 is an assembly process chart showing the MCP detector according to the first embodiment, in which a 3-terminal structure is adopted as a modification of the voltage application structure.

Herein, the MCP detector shown in FIG. 3 and FIG. 4 adopts, as a voltage application structure to each electrode, the 4-terminal voltage application structure such that a voltage-applying lead is arranged to each of the IN-electrode 1, the OUT-electrode 3, the acceleration electrode 5 (acceleration electrode substrate 50), the anode electrode 4 (anode electrode substrate 40). However, when the acceleration electrode 5 and the anode electrode 4 are set to the same potential as described above, a 3-terminal voltage application structure may be adopted as shown in FIG. 6. FIG. 6 is an assembly process chart of an MCP detector according to a second embodiment, in which the 3-terminal structure is adopted as a modification of the voltage application structure.

That is, between the acceleration electrode substrate 50 and the anode electrode substrate 40, a metallic short-circuit part 850 is arranged. In this case, one end of the short-circuit part 850 is electrically connected to the acceleration electrode substrate 50 (one end of the short-circuit part 850 is sandwiched by the acceleration electrode substrate 50 and the thin plate 851) by a thin plate 851 (which is a ring-shaped metallic part, similar to the above-described thin plates 801 to 803). On the other hand, the other end of the short-circuit part 850 is electrically connected to the anode electrode substrate 40 (the other end of the short-circuit part 850 is sandwiched by the anode electrode substrate 40 and the thin plate 852) by a thin plate 852 (which is a ring-shaped metallic part, similar to the above-described thin plates 801 to 803). In this configuration, the acceleration electrode substrate 50 and the anode electrode substrate 40 are short-circuited, and thus, the acceleration electrode 5 and the anode electrode 4 are set to the same potential (it becomes possible to set the potential via a voltage-applying lead arranged in the anode electrode substrate 40). It is noted that out of the structure shown in FIG. 6, the remaining part other than the above-described voltage application structure complies with the structure shown in FIG. 3.

The above-described 3-terminal voltage application structure is particularly effective when applied to the existing time-of-flight mass spectrometer. In the conventional MCP detector (floating anode structure) applied to the existing time-of-flight mass spectrometer, the acceleration electrode does not exist between the MCP cluster 2 and the anode electrode 4 unlike the MCP detector according to the present invention. Thus, the 3-terminal voltage application structure is adopted from the start. Therefore, as shown in FIG. 6, when the MCP detector according to the present invention also adopts the 3-terminal voltage application structure, it becomes easy to apply the MCP detector according to the present invention to the existing time-of-flight mass spectrometer without making design modifications. However, in a configuration in which the acceleration electrode 5 and the anode electrode 4 are set to the same potential by the 3-terminal voltage application structure, a current flowing in the acceleration electrode 5 produces voltage in the voltage-applying lead of the anode electrode 4. Thus, it is probable that ringing occurs. In this case, as shown in FIG. 3 and FIG. 4, the ringing can be sufficiently inhibited by arranging the capacitor between the acceleration electrode substrate 50 and the substrate 501 (ground potential).

Figure 7:
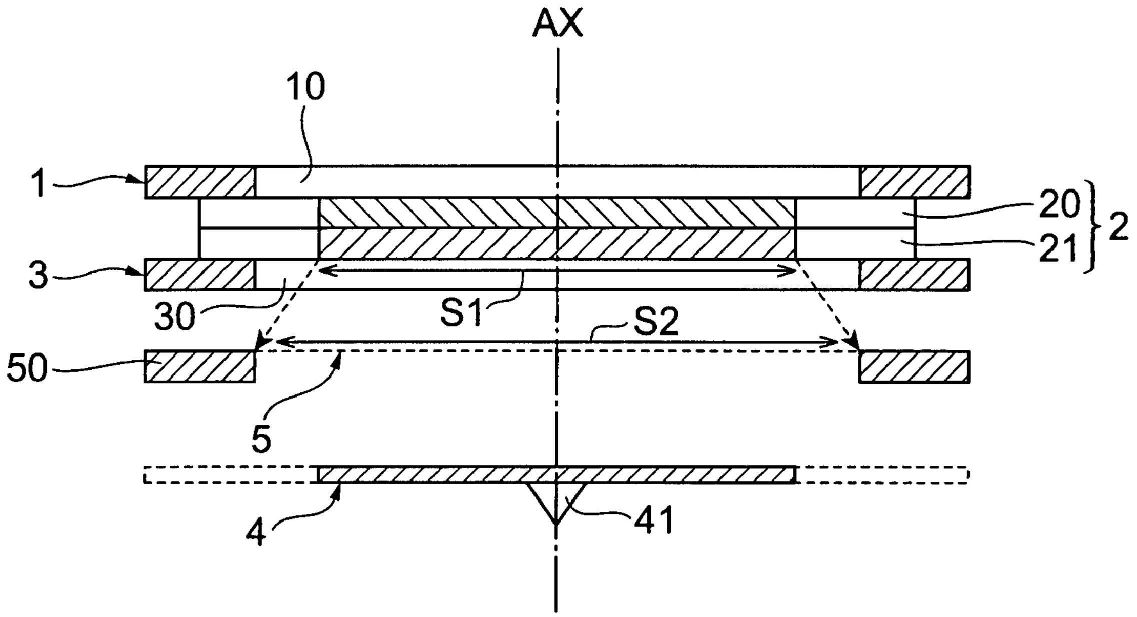
FIG. 7 is a cross-sectional view for describing a structural characteristic of an MCP unit (an MCP unit according to the present invention) applied to the MCP detector according to the first embodiment.

In the MCP unit applicable to the MCP detector according to the present invention, the effective area in the acceleration electrode 5 is preferably wider than the effective area (where a channel releasing secondary electrons is formed) of the exit surface of the MCP cluster 2. FIG. 7 is a cross-sectional view for describing a structural characteristic of an MCP unit (an MCP unit according to the present invention) applied to the MCP detector according to the first embodiment.

That is, the effective area on the exit surface of the MCP cluster 2 has a circular shape of a diameter S1. On the other hand, the effective area in the acceleration electrode 5 is defined by a center opening covered with a metallic mesh, and a diameter S2 of the center opening is larger than the diameter S1 of the effective area on the exit surface of the MCP cluster 2. The application of the MCP unit having such a structure permits inhibiting of a collision of the secondary electrons released from the MCP cluster 2 with the acceleration electrode 5, thereby making it possible to improve detection sensibility.

Figure 8A:
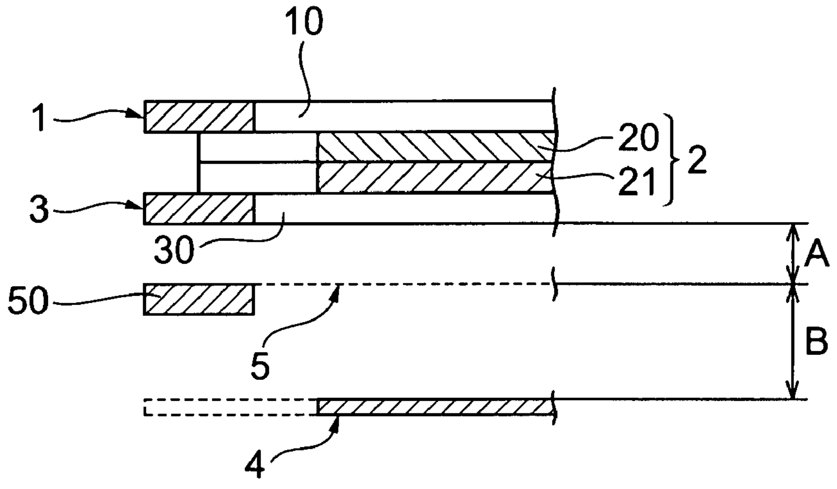
FIG. 8A is a cross-sectional view showing a configuration of the MCP unit applied to the MCP detector according to the first embodiment.

Additionally, in the MCP detector according to the first embodiment, the acceleration electrode 5 is arranged between the MCP cluster 2 and the anode electrode 4 so that a shortest distance B to the anode electrode 4 is longer than a shortest distance A to the exit surface of the MCP cluster 2, as shown in FIG. 8A. That is, the acceleration electrode 5 is arranged between the MCP cluster 2 and the anode electrode 4 so that a condition of A<B is satisfied. Thus, it becomes possible to greatly shorten the FWHM of the detected peak, thereby improving a time response characteristic. This arrangement is thus made because of the discovery by the inventors that the adjustment of arrangement conditions of the MCP cluster 2, the acceleration electrode 5, and the anode electrode 4 permits reducing the FWHM of a peak appearing on a detected time spectrum. That is, the adjustment of the distance A between the MCP cluster 2 and the acceleration electrode 5 contributes to control of a rise time of the detected peak, and the distance B between the acceleration electrode 5 and the anode electrode 4 contributes to control of a fall time of the detected peak.

Figure 8B:
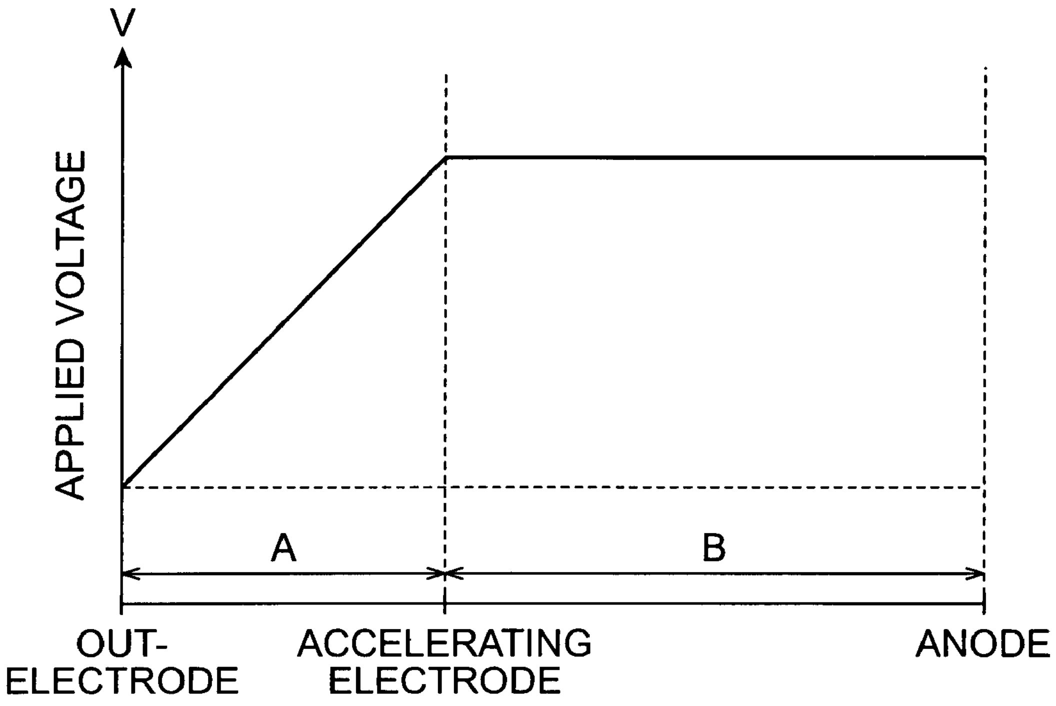
FIG. 8B is a diagram for describing a voltage application state between an OUT-electrode and an anode.

The acceleration electrode 5 may be set higher in potential than the OUT-electrode 3. However, as shown in FIG. 8B, when the acceleration electrode 5 is set to the same potential as that of the anode electrode 4, it becomes possible to arbitrarily limit an acceleration area of the secondary electrons released from the MCP cluster 2, as compared to the conventional MCP detector (a released time spreading is inhibited, and thus, it becomes possible to shorten the rise time of the detected peak, as compared to the conventional case).

More specifically, the shortest distance A that affects the control of the rise time of the detected peak is preferably 0.1 mm or more but 2.0 mm or less. That is, in order to shorten the rise time of the detected peak, it is desired that the shortest distance A is as short as possible. Here, the shortest distance A is preferably 0.1 mm or more to maintain a discharge withstand voltage with the OUT-electrode 3. On the other hand, when the shortest distance A exceeds 2.0 mm, the rise time of the detected peak is long, and thus, the time response characteristic deteriorates. It is noted that in view of assembly accuracy of the MCP detector, the shortest distance A practically is set to about 0.5 mm.

The shortest distance B that affects the control of the fall time of the detected peak is preferably 1.0 mm or more but 10 mm or less. That is, in order to shorten the fall time of the detected peak, it is desired that the shortest distance B is as long as possible. However, when the shortest distance B exceeds 10 mm, distortion of an electric potential distribution between the acceleration electrode 5 and the anode electrode 4 is more likely to occur. Thus, deterioration in detection accuracy is caused. On the other hand, considering that the practical value of the shortest distance A is 0.5 mm, it is reasonable to retain the shortest distance B at least about twice the shortest distance A. Thus, the shortest distance B is preferably 1.0 mm or more. It is noted that in order to prevent deterioration in detection accuracy, the shortest distance B practically is set to about 5.0 mm.

Figure 9:
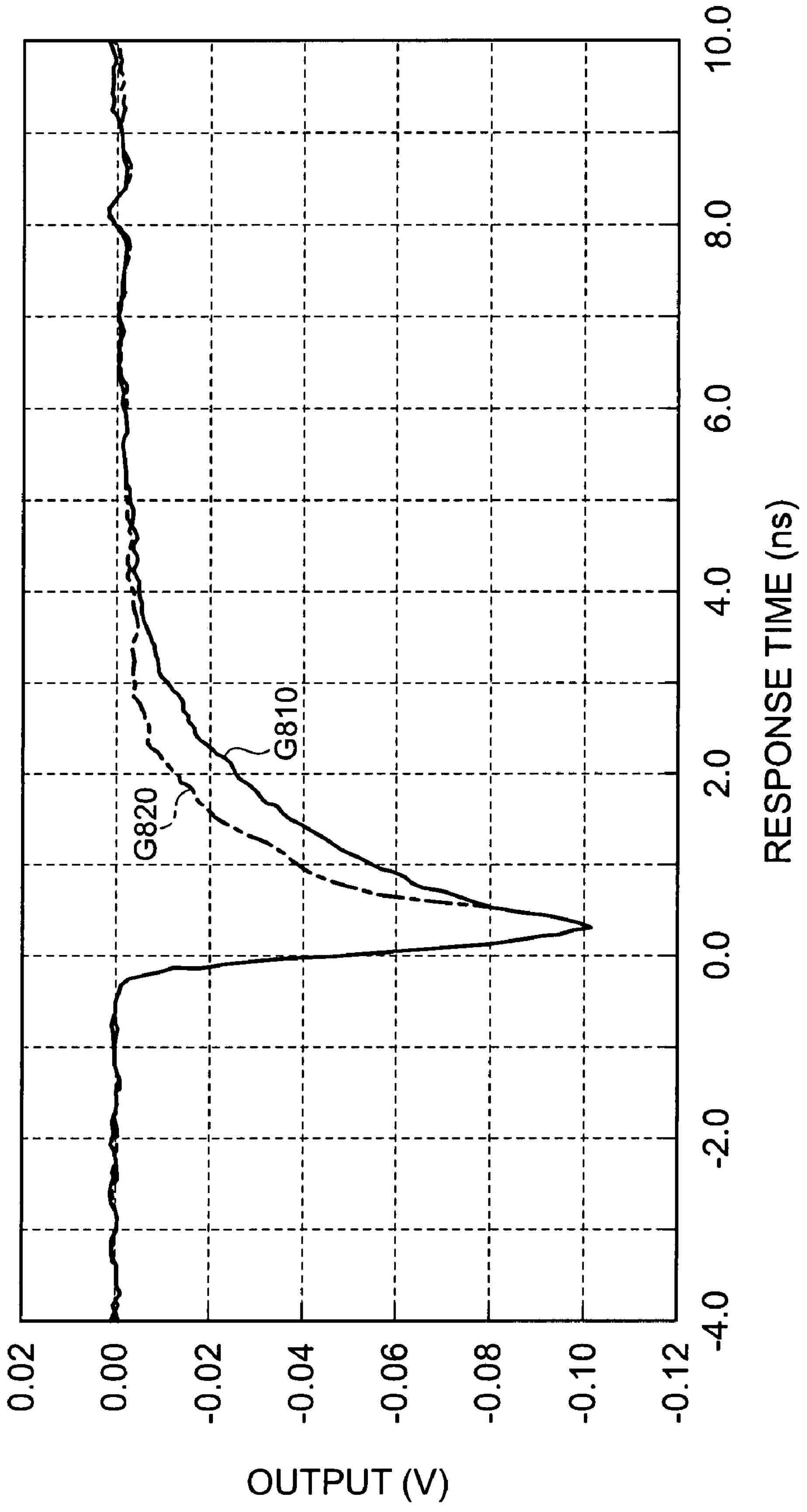
FIG. 9 is a graph showing a response characteristic of the MCP detector according to the first embodiment.
Figures 10A, 10B:
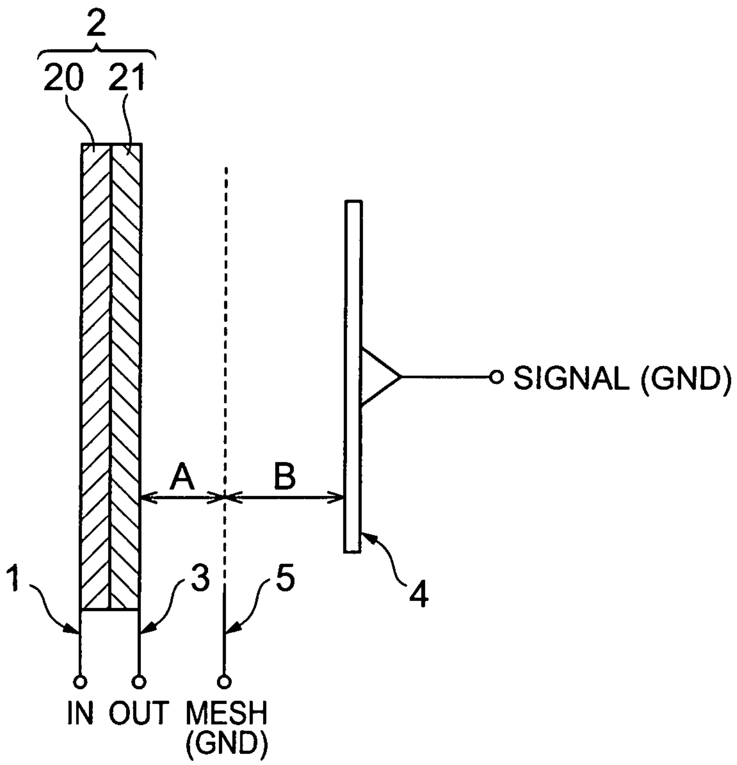
FIG. 10A is a cross-sectional view showing a configuration (a representative configuration of the MCP unit applied to the MCP detector according to the present invention) of the MCP unit prepared for measuring the response characteristic in FIG. 9.
FIG. 10B is a table showing measurement results.

FIG. 9 is a graph showing a response characteristic of the MCP detector including the MCP unit thus designed. FIG. 10A is a cross-sectional view showing a configuration (measurement system) of an MCP unit prepared for measuring the response characteristic of FIG. 9. FIG. 10B is a table showing measurement results.

The prepared measurement system is an MCP unit comprising: the MCP cluster 2 in which the IN-electrode 1 is arranged on the incident surface side and the OUT-electrode 3 is arranged on the exit surface side; the anode electrode 4; and the acceleration electrode 5 arranged between the MCP cluster 2 and the anode electrode 4, as described in FIG. 10A. In the MCP unit of such a measurement system, the anode electrode 4 and the acceleration electrode 5 are set to a ground level, the OUT-electrode 3 is set to −500V, and the IN-electrode 1 is set to −2000V. The effective area of the acceleration electrode 5 is constituted by a metallic mesh (40 μm in line width, 0.4 mm in wiring pitch) of which the opening ratio is 81%.

The measurement was performed by monitoring a time change of an output voltage obtained from the anode electrode 4 while changing the shortest distance A between the MCP cluster 2 and the acceleration electrode 5 and the shortest distance B between the acceleration electrode 5 and the anode electrode 4, shown in FIG. 10A. That is, as shown in FIG. 10B, a case 1 in which the distance A is 1.1 mm and the distance B is also 1.1 mm; a case 2 in which the distance A is 1.1 mm and the distance B is 2.6 mm; and a case 3 in which the distance A is 2.6 mm and the distance B is 1.1 mm were measured. A graph G810 shown in FIG. 9 represents a time spectrum of the case 1 (A=B) and a graph G820 represents the case 2 (A<B). As understood from FIG. 9, in the case 2, the fall time of the detected peak is greatly shortened, and concurrent therewith, the full width at half maximum (FWHM) of the detected peak is also greatly reduced. On the other hand, although not shown in FIG. 9, the case 3 provides, in the end, nearly the same FWHM of the detected peak as that of the case 1. However, contrary to the shortening of the fall time of the detected peak, the rise time is extended. Thus, in the case 3, the fall time and the rise time change in association with each other. Therefore, it is difficult to perform waveform shaping of the detected peak.

Subsequently, FIGS. 11A to 11C are diagrams for describing a structure of the acceleration electrode. As shown in FIG. 11A, the acceleration electrode 5 is constituted by the acceleration electrode substrate 50 in which a circular opening 5*a* is arranged at its center, and a metallic mesh 51 attached in a manner to cover the opening 5*a*. The metallic mesh 51 is obtained by arranging metallic wires of a predetermined line width in a lattice manner, as shown in FIG. 11B. The limit of the line width is probably about 40 μm in view of manufacturing restriction and mechanical strength. FIG. 11C is a table showing a relationship between opening ratios and wiring pitches of the metallic mesh 51 configured by 40 μm in line width.

Figures 12A, 12B:
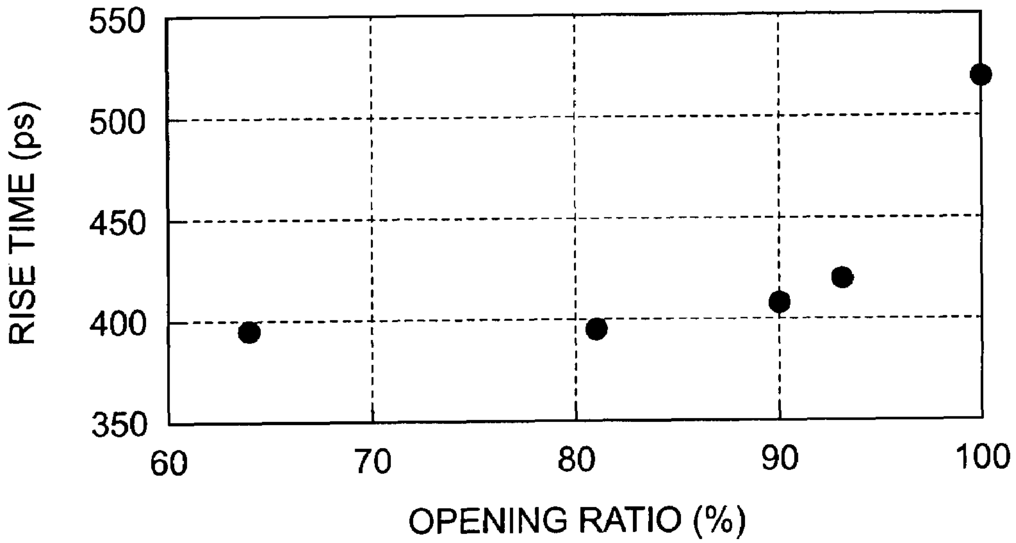
FIG. 12A is a graph showing a relationship between an opening ratio (%) and a rise time (ps) of the acceleration electrode applied to the MCP detector according to the first embodiment.
FIG. 12B is a table showing measurement conditions.

The opening ratio (opening ratio of the metallic mesh) in the effective area of the acceleration electrode 5 having the above-described configuration is preferably 60% or more but 95% or less. The reason for this is that when the opening ratio is below 60%, the number of passed electrons (transmissivity of the acceleration electrode) decreases, and the amount of signals obtained from the anode is reduced; and when the opening ratio exceeds 95%, however, the waveform shaping of the detected peak in the obtained time spectrum cannot be practically performed. FIG. 12A is a graph showing a relationship between the opening ratio (%) and the rise time (ps) of the acceleration electrode, and FIG. 12B is a table showing measurement conditions, regarding the MCP unit shown in FIG. 8A.

Figure 13A:
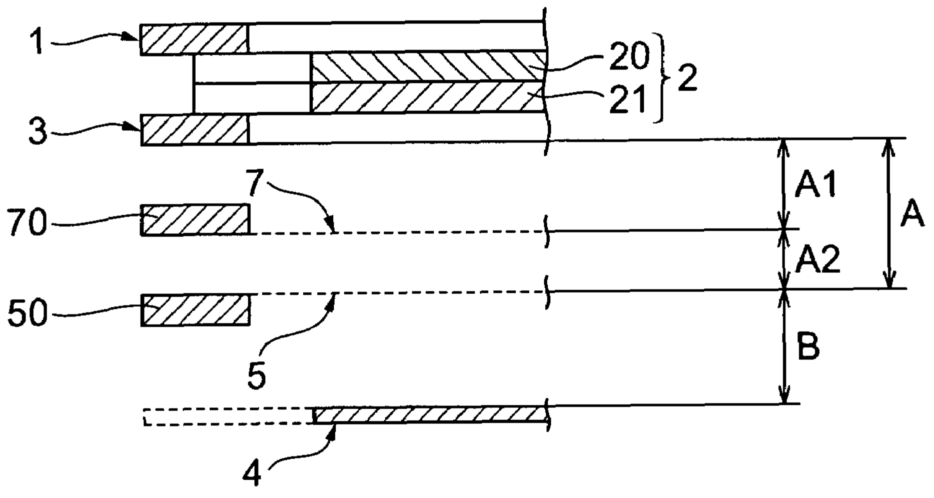
FIG. 13A is a cross-sectional view showing a configuration of a first application example of an MCP unit applied to the MCP detector according to the first embodiment.

It is noted that the first embodiment is not limited to the above-described configuration, and may be configured such that a delay electrode 7 is further arranged between the MCP cluster 2 and the acceleration electrode 5. FIG. 13A is a cross-sectional view showing a configuration of a first application example of the MCP unit applied to the MCP detector according to the first embodiment, and FIG. 13B is a graph for describing a voltage application state between the OUT-electrode 3 and the anode electrode 4.

As shown in FIG. 13A, the delay electrode 7 also includes a metallic mesh having a plurality of openings which permit passing of secondary electrons migrating from the exit surface of the MCP cluster 2 toward the anode electrode 4, similar to the acceleration electrode 5. That is, the delay electrode 7 is constituted by a delay electrode substrate 70 in which a circular opening is arranged at its center, and the metallic mesh attached to the delay electrode substrate 70 in a manner to cover the opening. It is noted that the opening ratio of the metallic mesh in the delay electrode 7 is preferably again 60% to 95%, similar to the acceleration electrode 5.

Figure 13B:
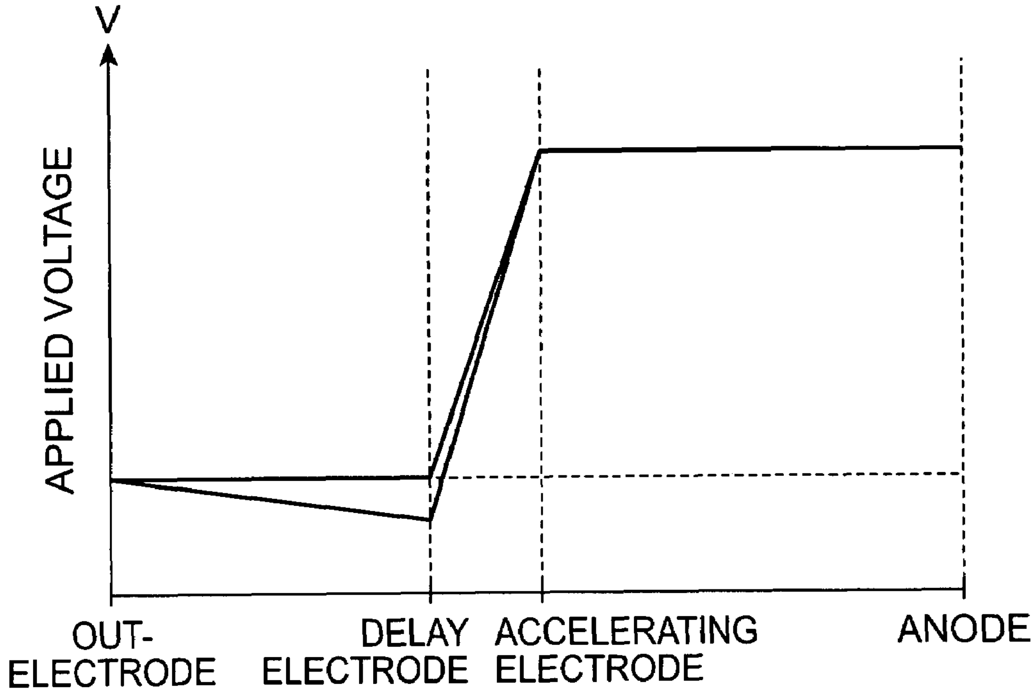
FIG. 13B is a graph for describing a voltage application state between an OUT-electrode and an anode.

In particular, the delay electrode 7 is preferably set equal to or lower in potential than the OUT-electrode 3, as shown in FIG. 13B. When the delay electrode 7 is set lower in potential than the OUT-electrode 3, it becomes possible to eliminate secondary electrons of low energy, thereby further inhibiting a time spreading of the secondary electrons, as compared to a case where the acceleration electrode 3 is arranged. In this case, the delay electrode 7 is preferably arranged in a position so that the shortest distance to the exit surface of the MCP cluster 2 is longer than the shortest distance to the acceleration electrode 5.

Figure 14A:
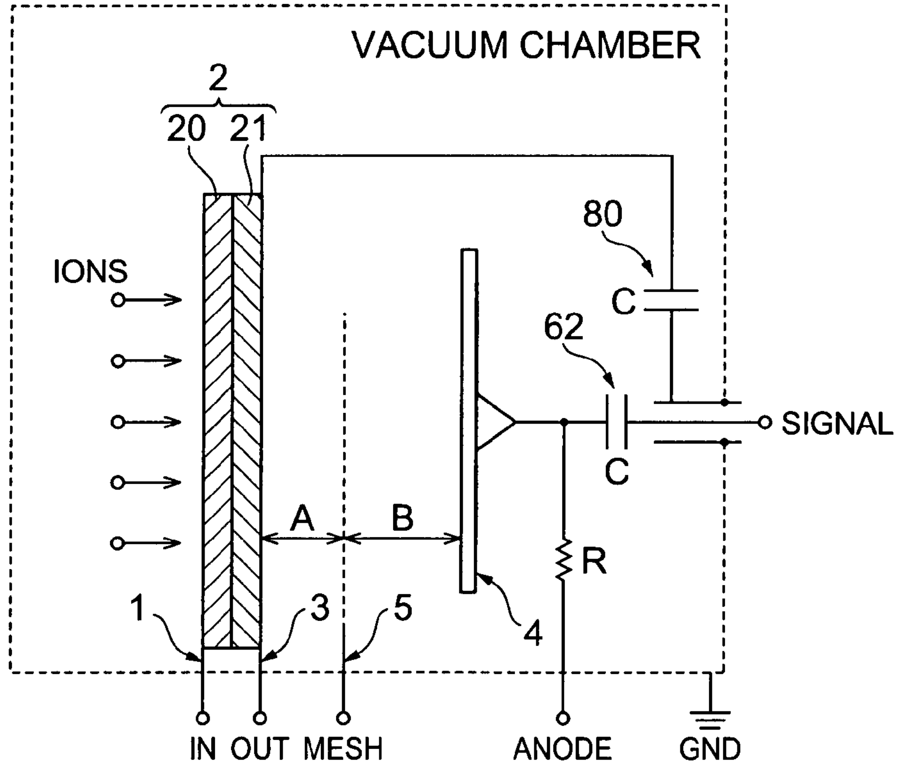
FIGS. 14A and 14B are equivalent circuit diagrams of second and third application examples of the MCP unit applied to the MCP detector according to the first embodiment.
Figure 14B:
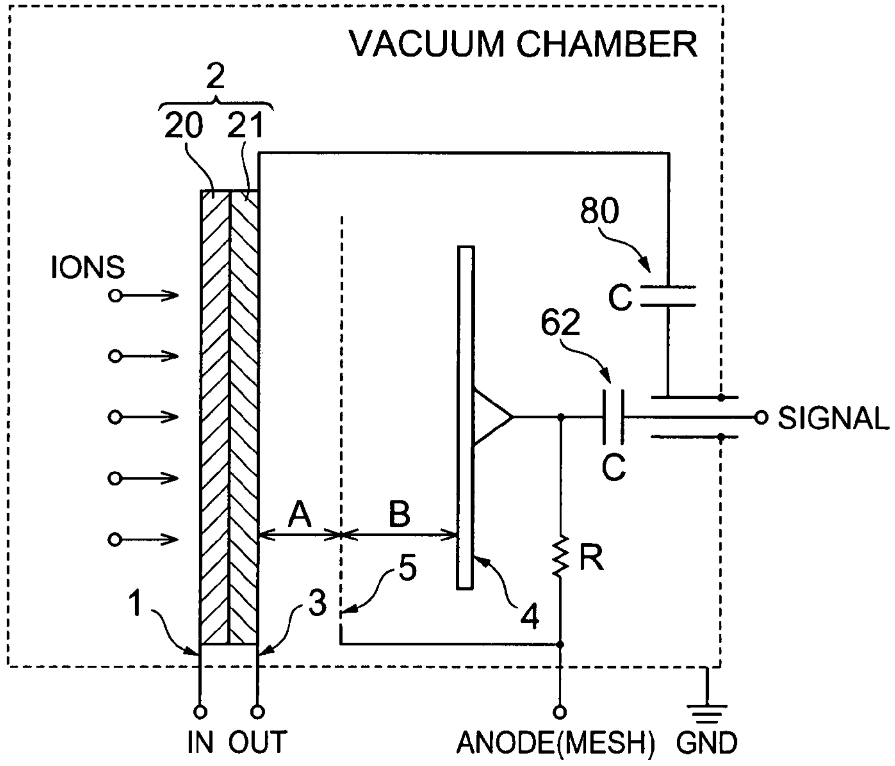

FIGS. 14A and 14B are equivalent circuit diagrams of second and third application examples of the MCP unit applied to the MCP detector according to the first embodiment.

That is, in the first embodiment, the acceleration electrode 5 is fixed lower in potential than the anode electrode 4, as shown in FIG. 5. However, as in a case of an MCP detector, shown in FIG. 14A, according to the second application example, the potential of the acceleration electrode 5 and that of the anode electrode 4 may be separately set. Further, as in a case of an MCP detector, shown in FIG. 14B, according to the third application example, the acceleration electrode 5 and the anode electrode 4 may be set to the same arbitrary potential, which is different from the ground level (the equivalent circuit shown in FIG. 14B is achieved by the MCP detector obtained by the assembly process shown in FIG. 6).

Second Embodiment

Subsequently, a second embodiment of the MCP detector according to the present invention is described in detail with reference to FIGS. 15 to FIG. 18. In the MCP detector according to the above-described first embodiment, the floating anode structure is adopted; and in the MCP detector according to the second embodiment, a grounded anode structure is adopted.

Figure 15:
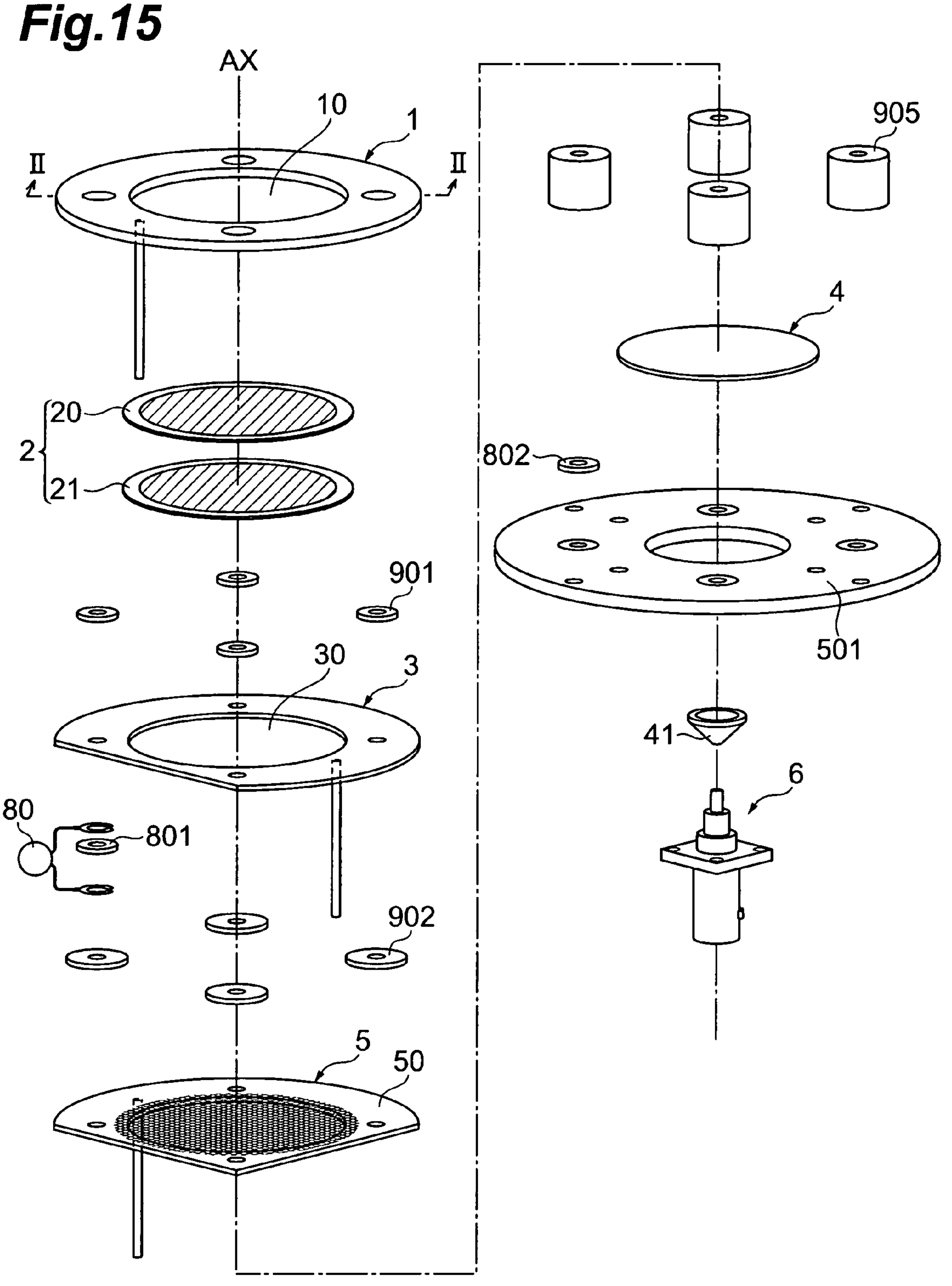
FIG. 15 is an assembly process chart (3-terminal voltage application structure) showing a configuration of a second embodiment of an MCP detector according to the present invention.
Figure 16:
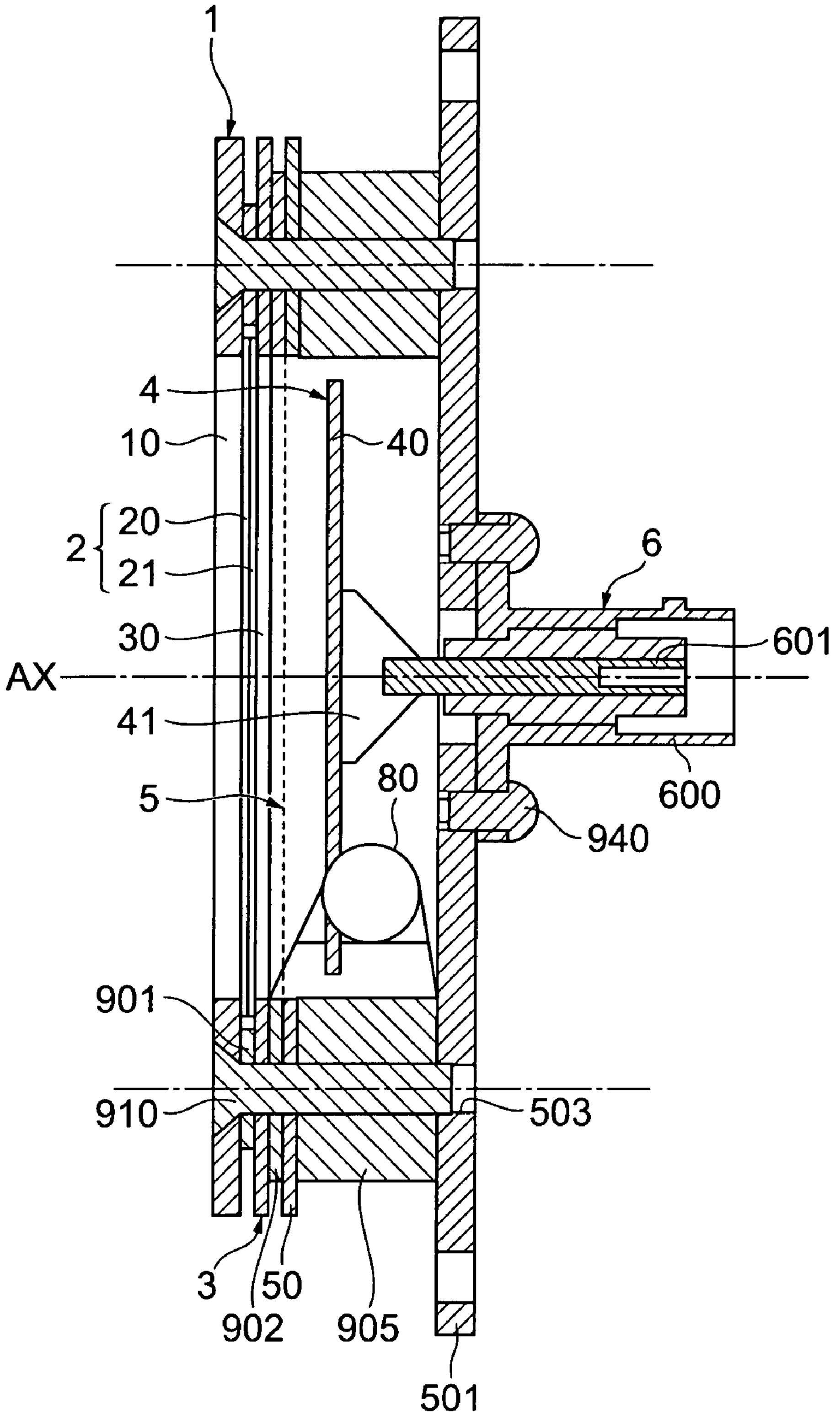
FIG. 16 is a diagram showing a cross-sectional structure, along the line II-II in FIG. 15, of the MCP detector according to the second embodiment.
Figure 17:
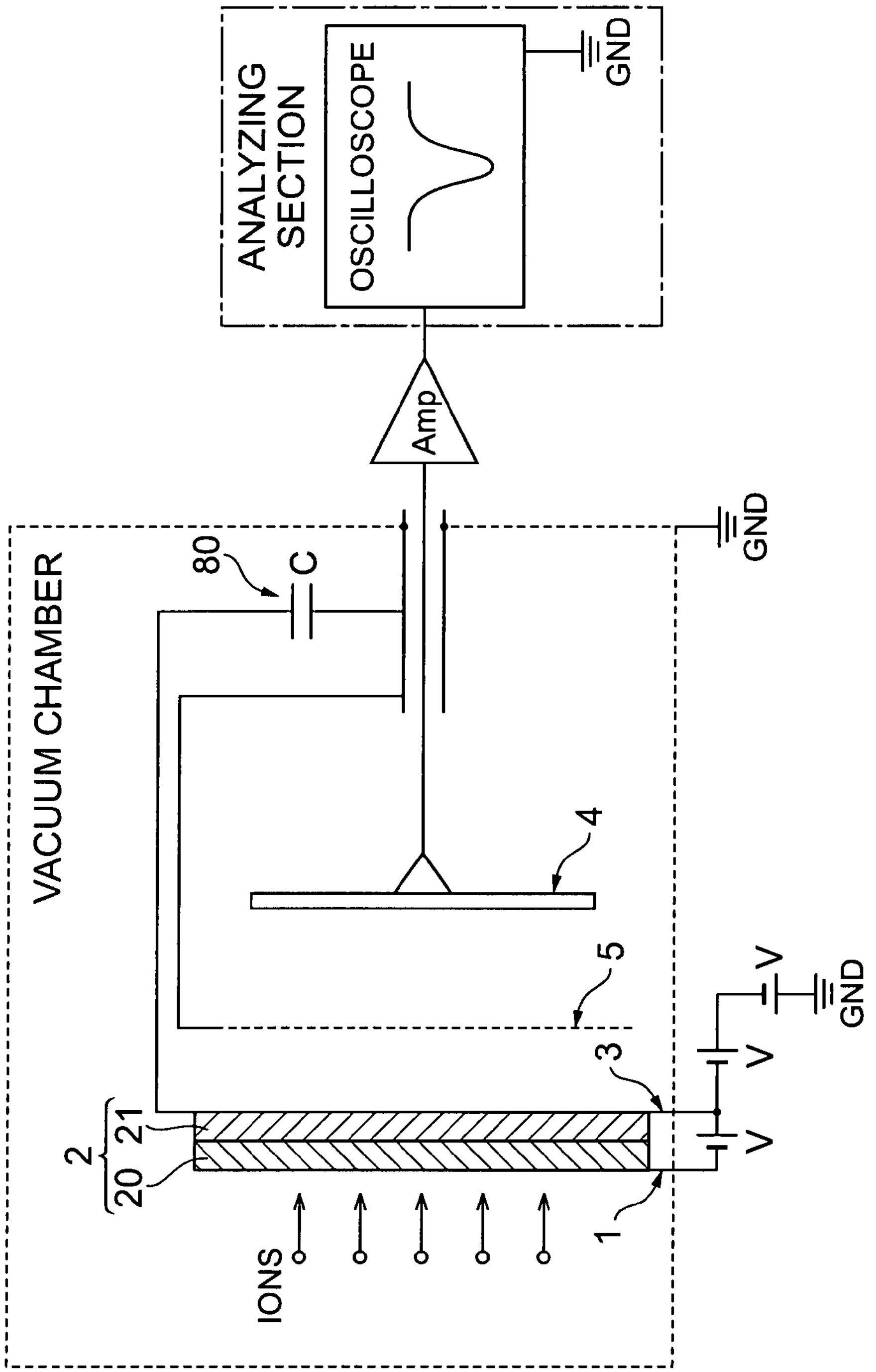
FIG. 17 is an equivalent circuit diagram of the MCP detector according to the second embodiment shown in FIGS. 15 to 16.
Figure 18:
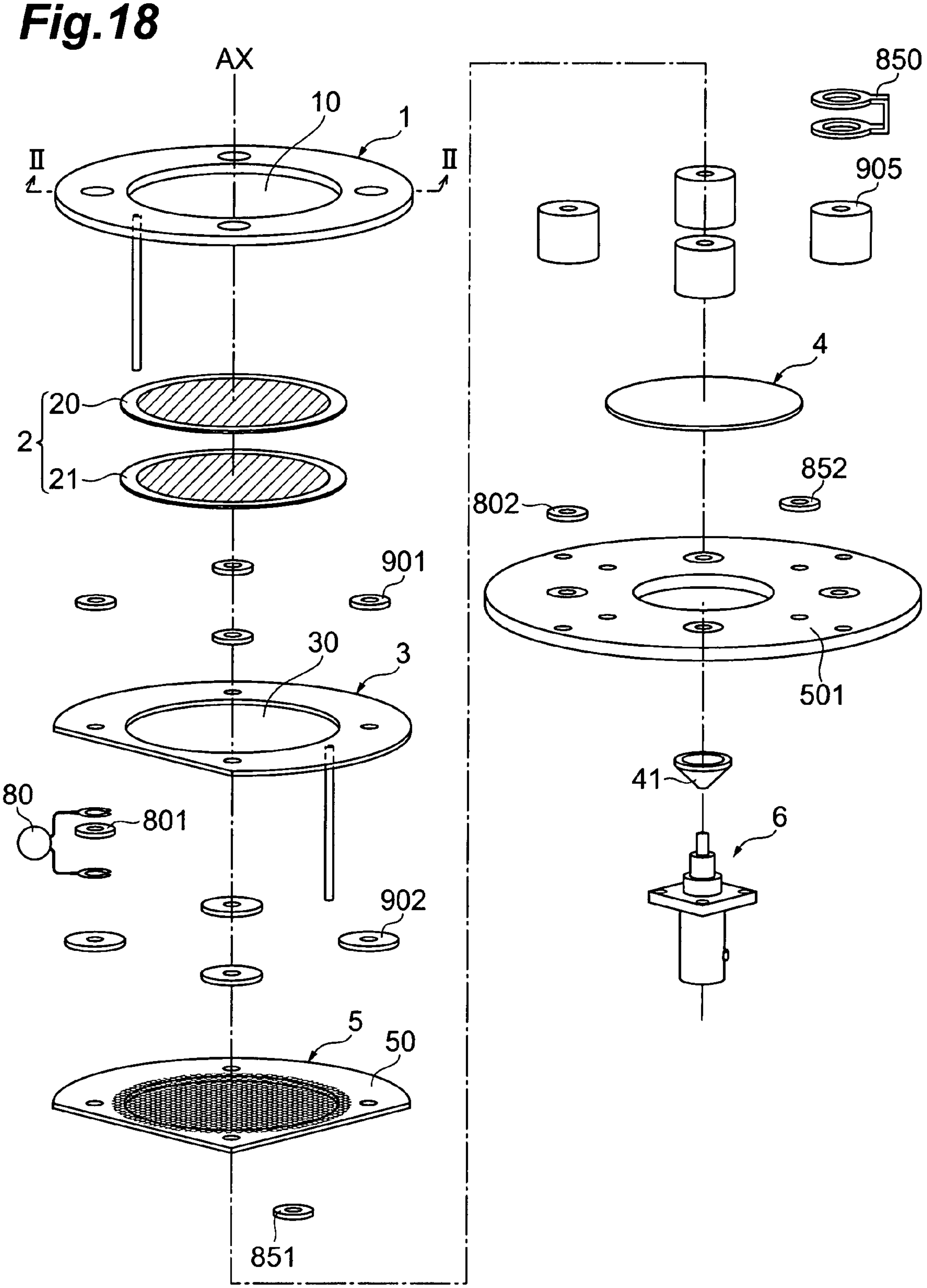
FIG. 18 is an assembly process chart of the MCP detector according to the second embodiment, in which a 2-terminal structure is adopted as a modification of the voltage application structure.

FIG. 15 is an assembly process chart showing a configuration of the second embodiment of the MCP detector according to the present invention. FIG. 16 is a diagram showing a cross-sectional structure, along the line II-II in FIG. 15, of the MCP detector according to the second embodiment. FIG. 17 is an equivalent circuit diagram of the MCP detector according to the second embodiment shown in FIGS. 15 to 16. FIG. 18 is an assembly process chart of the MCP detector according to the second embodiment, in which a 2-terminal structure is adopted as a modification of the voltage application structure.

The MCP detector according to the second embodiment has a configuration in which the IN-electrode 1 (first electrode), the MCP cluster 2, the OUT-electrode 3 (second electrode), the acceleration electrode 5, and the anode electrode 4 (third electrode) are arranged in this order along the tube axis (reference axis) AX, as shown in FIG. 15 and in FIG. 16. The MCP cluster 2 is constituted by the two disk-shaped MCPs 20, 21. On the incident surface (front surface where charged particles reach) side of the MCP cluster 2, the IN-electrode 1 (first electrode) is arranged, while on the exit surface (rear surface) side thereof, the OUT-electrode 3 (second electrode) is arranged. Thereby, the MCP cluster 2 is sandwiched by the IN-electrode 1 and the OUT-electrode 3. The MCP detector shown in FIG. 15 and FIG. 16 adopts, as a voltage application structure, a 3-terminal voltage application structure such that a voltage-applying lead is arranged to each of the IN-electrode (first electrode) 1, the OUT-electrode (second electrode) 3, the acceleration electrode 5 (acceleration electrode substrate 50), and the anode electrode 4.

The IN-electrode 1 is a metallic (comprised of stainless steel, for example) electrode in a donut-like shape in which the opening 10 is arranged at its center, and the board surface of the IN-electrode 1 is formed with the holes, arranged to be spaced apart by 90 degrees about the tube axis AX, into which the four countersunk screws 910 are inserted. The rear surface of the IN-electrode 1 is electrically connected with the IN-lead, comprised of a conductive material (comprised of stainless steel, for example), having a rod-like shape extending from a backward direction. A connection position between the IN-electrode 1 and the IN-lead lies in the middle of the two adjacent holes. The IN-lead is held in a state to be inserted into the IN-lead insulator comprised of an insulating material, and in this configuration, the IN-lead is insulated from the other constituent components. For the IN-lead insulator, a PEEK (PolyEtheretherKetone) resin excellent in workability, heat resistance, anti-shock property, and insulating property is appropriate, for example.

The OUT-electrode 3 is also a metallic electrode having a donut-like shape in which the opening 30 is arranged at its center, similar to the IN-electrode 1. However, the OUT-electrode 3 has a configuration in which a part thereof is cut so as not to be in contact with the IN-lead insulator accommodating the IN-lead. On the board surface of the OUT-electrode 3, similar holes are arranged in positions corresponding to the holes of the IN-electrode 1. The rear surface of the OUT-electrode 3 is electrically connected with the OUT-lead, comprised of a conductive material (comprised of stainless steel, for example) having a rod-like shape extending from a backward direction. The OUT-lead is arranged in a position, as viewed from the front, obtained by rotating the IN-lead by 90 degrees about the tube axis AX in a counterclockwise direction. The OUT-lead is also held (insulated from the other constituent components) in a state to be inserted into the OUT-lead insulator comprised of an insulating material such as a PEEK resin, for example, similar to the IN-lead.

Between the IN-electrode 1 and the OUT-electrode 3, the MCP insulators 901, comprised of an insulating material, having a donut-like shape are arranged in positions corresponding to the respective holes of the IN-electrode 1 and the OUT-electrode 3. The MCP insulators 901 are comprised of a PEEK resin, for example, and have a thickness slightly thinner than that of the MCP cluster 2. The MCP assembly in which the MCP cluster 2 is thus sandwiched by the IN-electrode 1 and the OUT-electrode 3 is obtained by accurately assembling such that centers of the disk-shaped MCPs 20 and 21 correspond to those of the openings 10 and 30 of the respective IN-electrode 1 and the OUT-electrode 3.

Behind the OUT-electrode 3, the acceleration electrode substrate 50 is arranged in a spaced manner. The acceleration electrode substrate 50 is a metallic electrode having an opening at its center, and is provided with a metallic mesh in a manner to cover the opening. The acceleration electrode 5 is constituted by the acceleration electrode substrate 50 and the metallic mesh. The acceleration electrode substrate 50 has a cutaway configuration so as not to be in contact with the IN-lead insulator accommodating the IN-lead and the OUT-lead insulator accommodating the OUT-lead. As described above, the acceleration electrode substrate 50 is spaced from the OUT-electrode 3. Thus, the acceleration electrode substrate 50 is provided with holes in positions corresponding to the holes of the OUT-electrode 3, and between the acceleration electrode substrate 50 and the OUT-electrode 3, the thin plate 801 comprised of a conductive material and the insulators 902 comprised of an insulating material, both of which have a donut-like shape, are arranged. The thin plate 801 is a metallic part for sandwiching, with the OUT-electrode 3, one end of the capacitor 80. For the thin plate 801, a material excellent in ductility is appropriate, and an example preferably includes a member in which a phosphor-bronze plate is plated with gold or copper. For the insulators 902, a PEEK resin is applicable, for example. It is noted that the opening provided in the acceleration electrode substrate 50 defines the effective area (a mesh area through which the secondary electrons released from the MCP cluster 2 pass) of the acceleration electrode 5, and is wider than the effective area (an area for releasing the secondary electrons) of the MCP cluster 2.

Behind the acceleration electrode substrate 50, the anode substrate 40 is arranged in a spaced manner. The anode substrate 40 has a disk shape formed of a glass epoxy resin, and its top and bottom surfaces are formed with predetermined patterns of a metallic thin film such as copper. The top-surface metallic thin film pattern and the bottom-surface metallic thin film pattern are conducting. The anode substrate 40 has a diameter nearly equal in size to that of the opening 30 of the OUT-electrode 3 so as not to be in contact with the IN-lead insulator accommodating the IN-lead and the OUT-lead insulator accommodating the OUT-lead.

Out of the metallic thin film patterns formed on each of the top and bottom surfaces of the anode substrate 40, the top-surface metallic thin film pattern is a circular shape that corresponds to that of the opening 30 of the OUT-electrode 3, and the opening 30 and the top-surface metallic thin film pattern are coaxially arranged. On the other hand, in the center of the bottom-surface metallic thin film pattern, the anode terminal 41 comprised of copper is screwed. The anode electrode (third electrode) 4 is constituted by the anode terminal 41 and the anode substrate 40. The anode substrate 40 is directly supported via the anode terminal 41 by the core wire 601 of the BNC terminal 6, which is a signal output section.

Behind the anode electrode 4, there is arranged the substrate 501, which is provided with screw holes. Between the acceleration electrode substrate 50 and the substrate 501, insulators 905 and the thin plate 802 are arranged. At this time, the electrically insulating screws 910 (a PEEK resin is applicable, for example) are fastened into the screw holes, and thus, each of the electrodes 1, 3 and 4, and the MCP cluster 2 are secured to the substrate 501. The thin plates 802 are metallic parts for sandwiching, together with the substrate 501, the other end of the capacitor 80. The thin plates 802 may also be formed of a material similar to that of the thin plates 801. For the insulators 905, a PEEK resin is applicable, for example. The substrate 501 has holes into which the respective lead-use insulators are inserted.

At the center of the substrate 501, the BNC terminal 6, which is a signal output section, is secured by the screw 940. The outside 600 of the BNC terminal 6 is electrically connected to the substrate 501. On the other hand, the core wire 601 inside the BNC terminal 6 is directly connected to the anode terminal 41. In this configuration, a signal output level is set to a GND level.

Between the OUT-electrode 3 and the substrate 501, the four capacitors 80, of which respective terminals are electrically connected to the OUT-electrode 3 and the substrate 501 by the above-described thin plates 801 and the thin plates 802, are equally spaced apart about the tube axis AX.

In the MCP detector, thus configured, according to the second embodiment, the IN-electrode 1, the OUT-electrode 3, the acceleration electrode 5 having a metallic mesh, and the anode 4 are set to predetermined potentials, as shown in FIG. 17. That is, when a minus potential set to the IN-electrode 1 serves as a reference, the OUT-electrode 3 is set to a minus potential higher than that of the IN-electrode 1. The acceleration electrode 5 and the anode 6 are located at a ground level. It is not always necessary that the acceleration electrode 5 and the anode 4 are set to the same potential. Thus, in the MCP detector according to the second embodiment, the grounded anode structure is adopted.

Herein, the MCP detector according to the second embodiment shown in FIG. 15 and FIG. 16 has, as a voltage application structure, a 3-terminal voltage application structure such that a voltage-applying lead is provided to each of the IN-electrode 1, the OUT-electrode 3, and the acceleration electrode 5 (acceleration electrode substrate 50). However, when the acceleration electrode 5 and the anode electrode 4 are set to the same potential as described above, the 2-terminal voltage application structure may be adopted as shown in FIG. 18. FIG. 18 is an assembly process chart of the MCP detector according to the second embodiment, in which a 2-terminal structure is adopted as a modification of the voltage application structure.

That is, between the acceleration electrode substrate 50 and the substrate 501, the metallic short-circuit part 850 is arranged. In this case, one end of the short-circuit part 850 is electrically connected to the acceleration electrode substrate 50 (one end of the short-circuit part 850 is sandwiched by the acceleration electrode substrate 50 and the thin plate 851) by the thin plate 851 (which is a ring-shaped metallic part, similar to the above-described thin plates 801 to 802). On the other hand, the other end of the short-circuit part 850 is electrically connected to the substrate 501 (the other end of the short-circuit part 850 is sandwiched by the substrate 501 and the thin plate 852) by the thin plate 852 (which is a ring-shaped metallic part, similar to the above-described thin plates 801 to 802). In this configuration, the acceleration electrode substrate 50 and the substrate 501 are short-circuited, and thus, the acceleration electrode 5 and the anode electrode 4 are set to the same potential. It is noted that out of the structure shown in FIG. 18, the remaining part other than the above-described voltage application structure complies with the structure shown in FIG. 15.

The above-described 2-terminal voltage application structure is particularly effective when applied to the existing time-of-flight mass spectrometer. In the conventional MCP detector (grounded anode structure) applied to the existing time-of-flight mass spectrometer, the acceleration electrode does not exist between the MCP cluster 2 and the anode electrode 4 unlike the MCP detector according to the present invention. Thus, the 2-terminal voltage application structure is adopted from the start. Therefore, as shown in FIG. 18, in the MCP detector according to the present invention, the 2-terminal voltage application structure is again adopted. Thus, it becomes easy to apply the MCP detector according to the present invention to the existing time-of-flight mass spectrometer without making design modifications. However, when the acceleration electrode 5 is set to the same potential (ground potential) as the anode electrode 4, the 3-terminal voltage application structure shown in FIG. 15 and FIG. 16 is more preferable in view of a reduction in ringing. That is, it is more preferable to locate the acceleration electrode 5 to an external ground potential, which is different from the ground potential of the MCP detector, in view of the reduction in ringing. The reason for this is that when a current flows in a substrate portion set to the ground potential, the ground level of the MCP detector itself is changed. In this case, as shown in FIG. 15 and FIG. 16, the ringing can be sufficiently inhibited by arranging the capacitor between the acceleration electrode substrate 50 and the substrate 501 (ground potential).

In the second embodiment having such a grounded anode structure, the acceleration electrode 5 is arranged again between the MCP cluster 2 and the anode electrode 4 so that the shortest distance B to the anode electrode 4 is longer than the shortest distance A to the exit surface of the MCP cluster 2. At this time, the shortest distance A from the exit surface of the MCP cluster 2 to the acceleration electrode 5 is preferably 0.1 mm or more but 2.0 mm or less. Further, the shortest distance B from the acceleration electrode 5 to the anode electrode 4 is preferably 1.0 mm or more but 10 mm or less.

In the second embodiment, the acceleration electrode 5 is again preferably set to the same potential as that of the anode electrode 4. The reason for this is that in this case, an acceleration area of the secondary electrons released from the MCP cluster 2 is limited (reduced to half or less, as compared to the conventional MCP detector in which the acceleration area ranges from the MCP cluster 2 to the anode electrode 4), and thus, the released time spreading is inhibited (see FIGS. 7A and 7B).

Further, in the second embodiment, the effective area in the acceleration electrode 5 is preferably wider than the effective area of the exit surface in the MCP cluster 2 (see FIG. 6). The reason for this is that the collision of the secondary electrons with the acceleration electrode is inhibited, and thus, detection sensitivity is improved.

In the second embodiment, the opening ratio of the effective area in the acceleration electrode 5 is preferably 60% or more but 95% or less. The reason for this is that when the opening ratio is below 60%, the number of passed electrons (transmissivity of the acceleration electrode) decreases, and the amount of signals obtained from the anode electrode 4 is reduced; and when the opening ratio exceeds 95%, however, the waveform shaping of the detected peak in the obtained time spectrum cannot be practically performed.

The MCP detector according to the second embodiment may further have a structure such that a delay electrode is arranged between the exit surface of the MCP cluster 2 and the acceleration electrode 5 (see FIGS. 12A and 12B). At this time, the delay electrode also includes a plurality of openings (metallic mesh) which permit passing of the secondary electrons migrating from the exit surface of the MCP cluster 2 toward the anode electrode 4, similar to the acceleration electrode 5. It is noted that the delay electrode is set equal to or lower in potential than the OUT-electrode 3. Additionally, the opening ratio of the delay electrode is 60% to 95%, similar to the acceleration electrode 5. In particular, when the delay electrode is set lower in potential than the OUT-electrode 3, it becomes possible to eliminate secondary electrons of low energy, thereby further inhibiting a time spreading of the secondary electrons, as compared to a case where the acceleration electrode 5 is arranged. In this case, the delay electrode is preferably arranged in a position so that the shortest distance to the exit surface of the MCP cluster 2 is longer than the shortest distance to the acceleration electrode 5.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An MCP unit comprising:

a micro-channel plate, for releasing secondary electrons internally multiplied in response to incidence of charged particles, arranged on a plane that intersects a predetermined reference axis, said micro-channel plate having an incident surface upon which the charged particles are incident, and an exit surface that opposes the incident surface and emits the secondary electrons;

a first electrode being in contact with the incident surface of said micro-channel plate, said first electrode being set to a predetermined potential;

a second electrode being in contact with the exit surface of said micro-channel plate, said second electrode being set higher in potential than said first electrode;

an anode arranged in a position where the secondary electrons released from the exit surface of said micro-channel plate reach, in a state to intersect the reference axis, said anode being set higher in potential than said second electrode; and an acceleration electrode arranged between said micro-channel plate and said anode such that a shortest distance to said anode is longer than a shortest distance to the exit surface of said micro-channel plate, said acceleration electrode being set higher in potential than said second electrode and having a plurality of openings which permit passing of the secondary electrons migrating from the exit surface of said micro-channel plate toward said anode.

2. An MCP unit according to claim 1, wherein the shortest distance from the exit surface of said micro-channel plate to said acceleration electrode is 0.1 mm or more but 2.0 mm or less.

3. An MCP unit according to claim 1, wherein the shortest distance from said acceleration electrode to said anode is 1.0 mm or more but 10 mm or less.

4. An MCP unit according to claim 1, wherein said acceleration electrode is set to the same potential as that of said anode.

5. An MCP unit according to claim 1, wherein an effective area in said acceleration electrode is wider than an effective area of the exit surface in said micro-channel plate.

6. An MCP unit according to claim 5, wherein an opening ratio of the effective area in said acceleration electrode is 60% or more but 95% or less.

7. An MCP unit according to claim 1, further comprising a delay electrode arranged between the exit surface of said micro-channel plate and said acceleration electrode, said delay electrode having a plurality of openings which permit passing of the secondary electrons migrating from the exit surface of said micro-channel plate toward said anode.

8. An MCP unit according to claim 7, wherein said delay electrode is set equal to or lower in potential than said second electrode.

9. An MCP unit according to claim 7, wherein said delay electrode is arranged in a position such that a shortest distance to the exit surface of said micro-channel plate is longer than a shortest distance to said acceleration electrode.

10. An MCP detector comprising:

an MCP unit according to claim 1; and a signal output section arranged to sandwich, together with said micro-channel plate, said anode, said signal output section having a signal line electrically connected to said anode.

11. An MCP detector according to claim 10, wherein said signal output section includes a coaxial cable that comprises the signal line and a shield part surrounding the signal line, and wherein said MCP detector further comprise a capacitor having a terminal of which one side is electrically connected to the shield part, and a terminal of which the other side is electrically connected to said acceleration electrode.

12. A time-of-flight mass spectrometer comprising:

a vacuum chamber having therein a sample, which is to be analyzed as an ion source;

an ion extracting system for releasing ions from the sample arranged in said vacuum chamber;

an ion accelerator for accelerating the ions released from the sample, arranged in said vacuum chamber;

an MCP detector according to claim 10 arranged to sandwich, together with the sample, said ion accelerator, and an analyzing section for determining at least masses as information about the ions released from the sample, said analyzing section for determining the masses of the ions that reach said MCP detector by detecting, based on a detection signal from said MCP detector, a time of flight from the ion accelerator to said MCP detector.

* * * * *